(12) United States Patent
Sonehara et al.

(10) Patent No.: US 10,665,533 B2
(45) Date of Patent: May 26, 2020

(54) LEAD FRAME AND SEMICONDUCTOR DEVICE

(71) Applicant: SHINKO ELECTRIC INDUSTRIES CO., LTD., Nagano-shi, Nagano-ken (JP)

(72) Inventors: Kesayuki Sonehara, Nagano (JP); Muneaki Kure, Nagano (JP); Yosuke Aruga, Nagano (JP)

(73) Assignee: Shinko Electric Industries, Co., Ltd. (JP)

( * ) Notice: Subject to any disclaimer, the term of this patent is extended or adjusted under 35 U.S.C. 154(b) by 0 days.

(21) Appl. No.: 16/178,779

(22) Filed: Nov. 2, 2018

(65) Prior Publication Data

US 2019/0157196 A1 May 23, 2019

(30) Foreign Application Priority Data

Nov. 21, 2017 (JP) .................. 2017-223851

(51) Int. Cl.
| | |
|---|---|
| *H01L 23/495* | (2006.01) |
| *H01L 23/31* | (2006.01) |
| *H01L 23/29* | (2006.01) |
| *H01L 21/48* | (2006.01) |

(52) U.S. Cl.
CPC .... *H01L 23/49582* (2013.01); *H01L 21/4825* (2013.01); *H01L 21/4828* (2013.01); *H01L 23/293* (2013.01); *H01L 23/3107* (2013.01); *H01L 23/4952* (2013.01); *H01L 23/49513* (2013.01); *H01L 23/49548* (2013.01); *H01L 23/49586* (2013.01); *H01L 2224/16245* (2013.01); *H01L 2224/32245* (2013.01); *H01L 2224/48247* (2013.01); *H01L 2224/73265* (2013.01); *H01L 2924/181* (2013.01)

(58) Field of Classification Search
CPC ......... H01L 23/49541; H01L 23/49558; H01L 23/49565
USPC .................................................. 257/666, 676
See application file for complete search history.

(56) References Cited

U.S. PATENT DOCUMENTS

| | | | | |
|---|---|---|---|---|
| 5,756,380 | A * | 5/1998 | Berg | ................... H01L 23/3128 438/126 |
| 7,049,683 | B1 * | 5/2006 | Sirinorakul | ............. H01L 24/48 257/666 |
| 8,564,107 | B2 * | 10/2013 | Cho | ................... H01L 23/49582 257/666 |
| 2004/0232534 | A1 * | 11/2004 | Seki | ......................... C25D 5/02 257/678 |
| 2006/0192294 | A1 * | 8/2006 | Lee | ..................... H01L 23/3107 257/778 |

(Continued)

FOREIGN PATENT DOCUMENTS

| | | |
|---|---|---|
| JP | 2004332105 A | 11/2004 |
| JP | 2004349497 A | 12/2004 |

*Primary Examiner* — David Vu
*Assistant Examiner* — Brandon C Fox
(74) *Attorney, Agent, or Firm* — Tarolli, Sundheim, Covell & Tummino LLP

(57) ABSTRACT

A lead frame includes a conductive member, a plating layer, and an oxide film. The conductive member includes a rough surface. The plating layer is formed on the rough surface and configured to be connected to a semiconductor element. The oxide film covers the rough surface at least around the plating layer.

20 Claims, 17 Drawing Sheets

(56) References Cited

U.S. PATENT DOCUMENTS

| | | | | |
|---|---|---|---|---|
| 2011/0079887 A1* | 4/2011 | Shim | ................... | H01L 23/3142 |
| | | | | 257/676 |
| 2011/0272184 A1* | 11/2011 | Park | ................. | H01L 23/49548 |
| | | | | 174/255 |
| 2013/0098659 A1* | 4/2013 | Kwan | ............... | H01L 23/49582 |
| | | | | 174/126.2 |

* cited by examiner

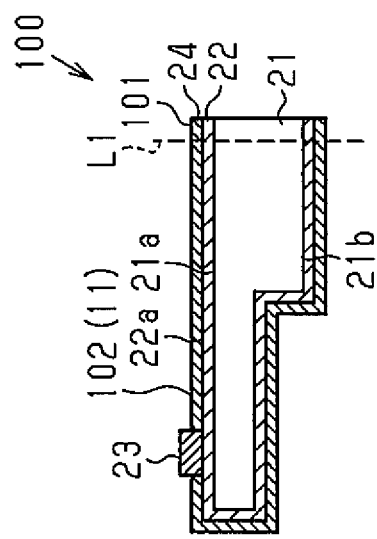
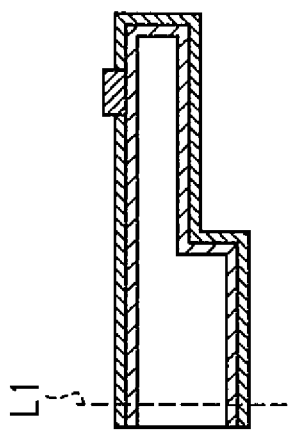
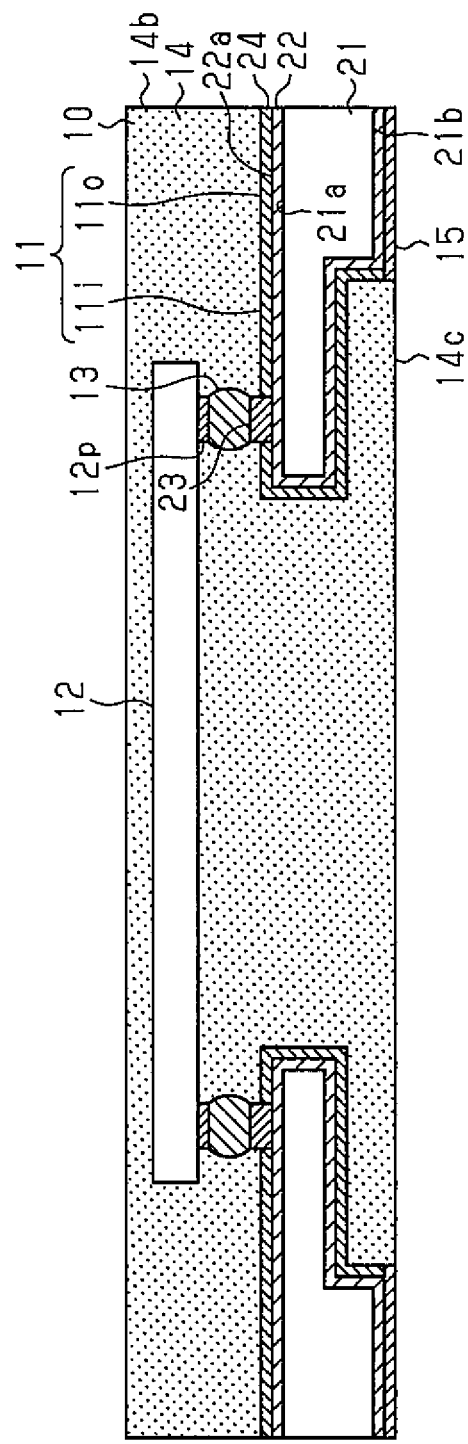
Fig. 1A
Fig. 1B

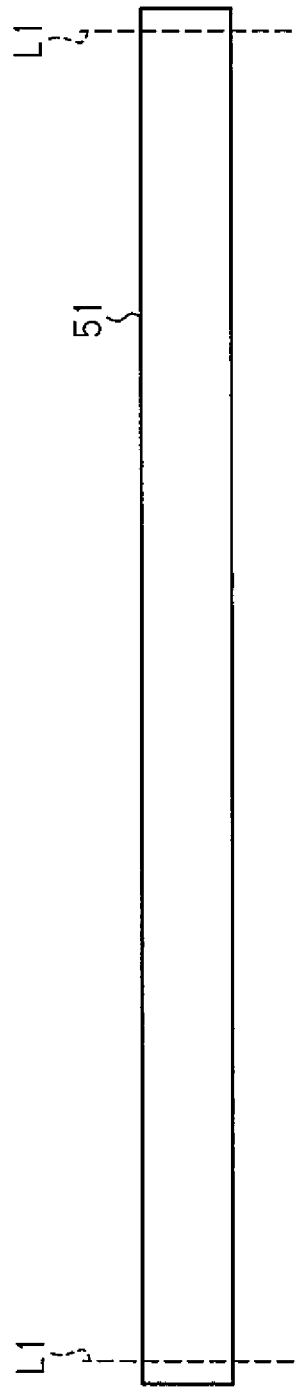

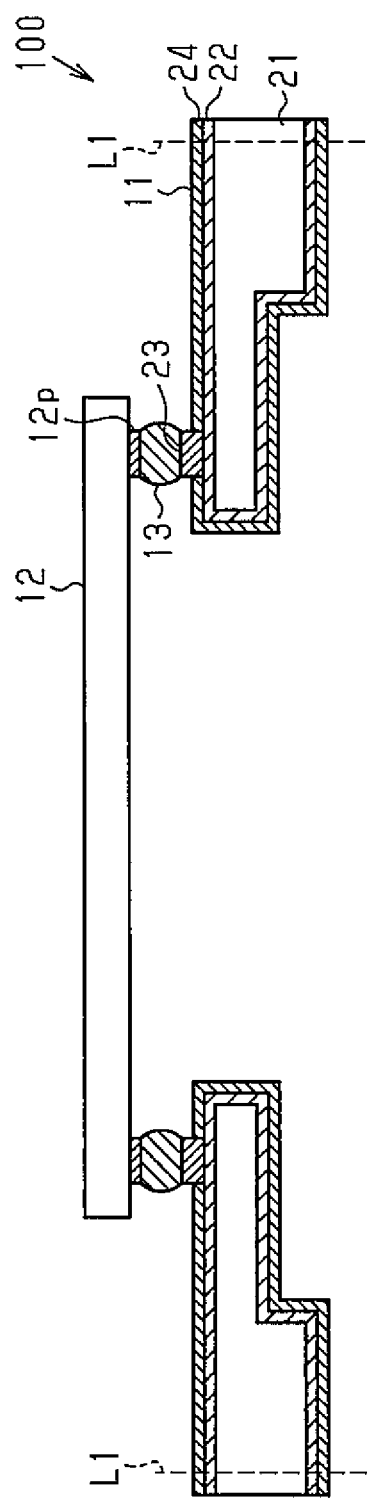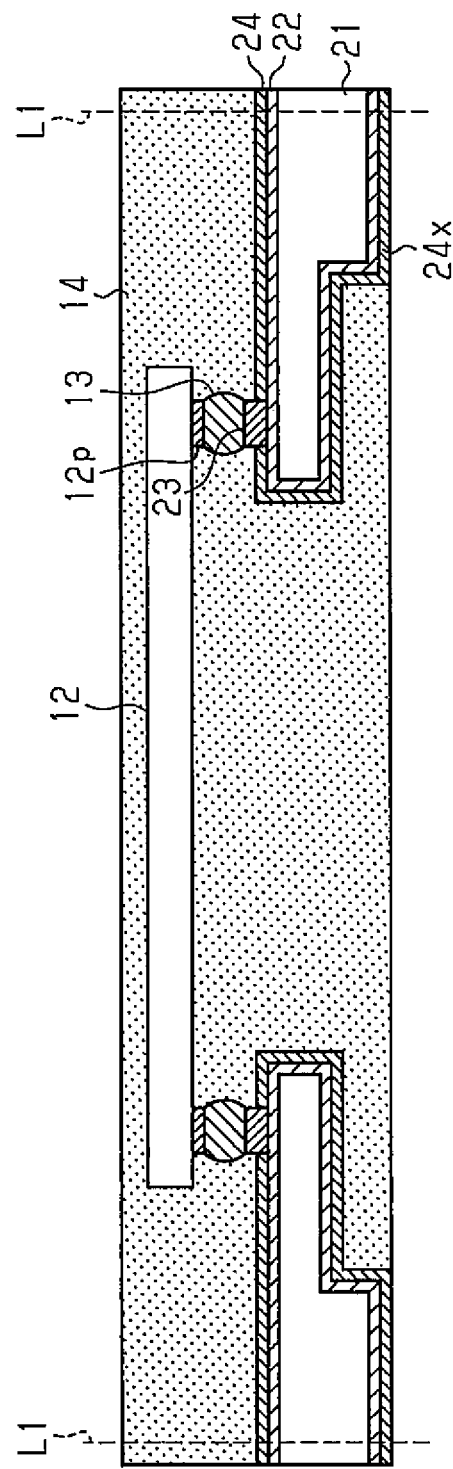

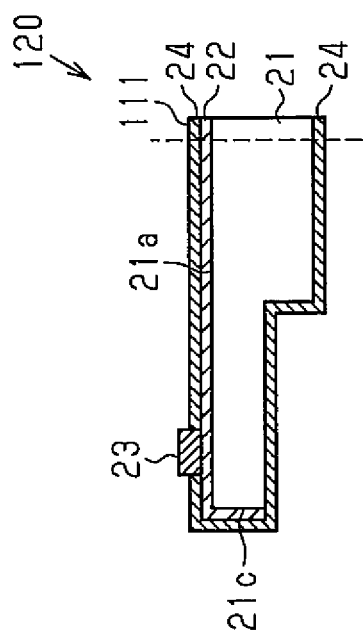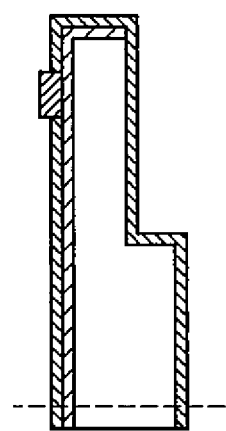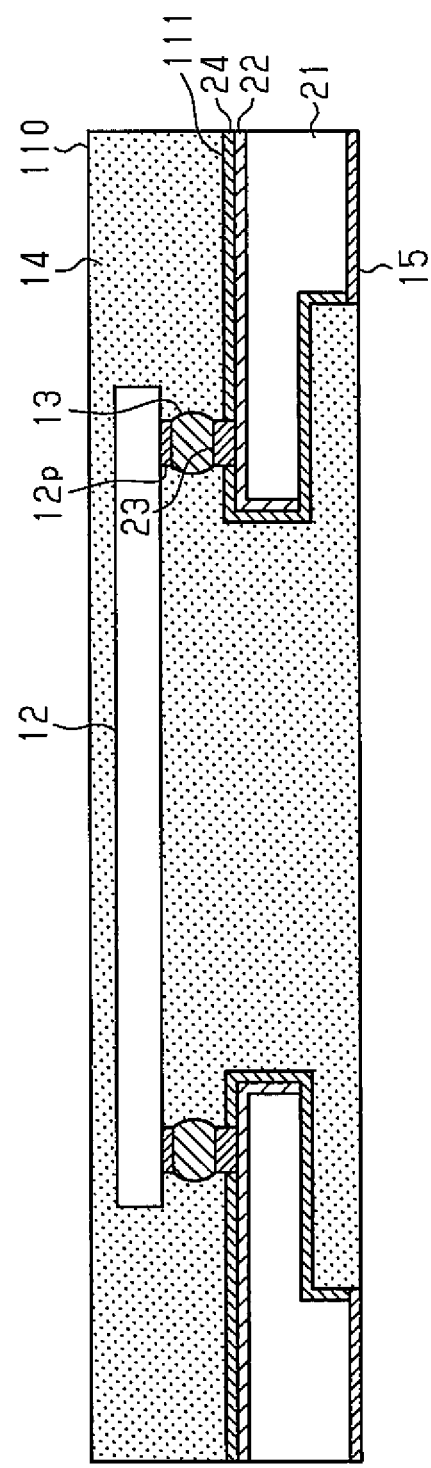
Fig.10A
Fig.10B

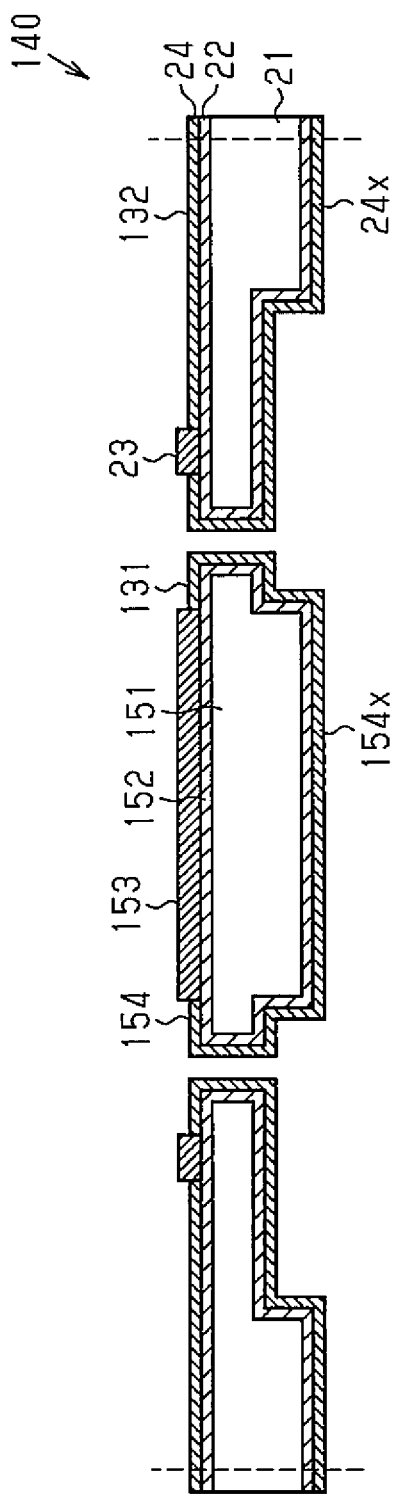
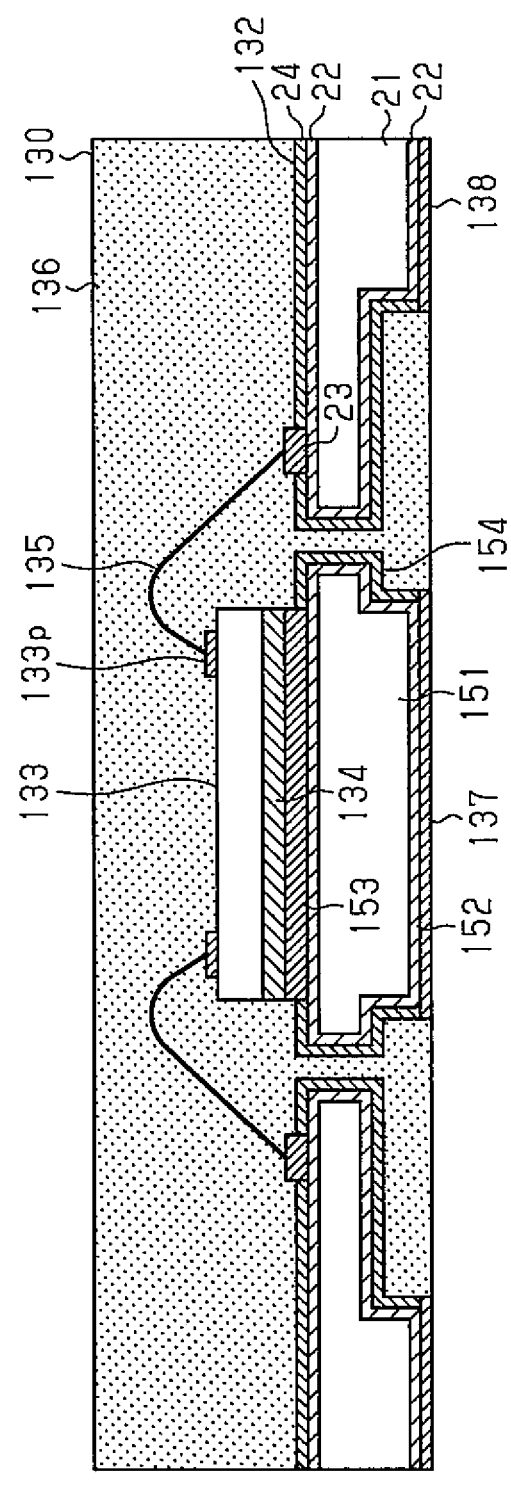
Fig.11A
Fig.11B

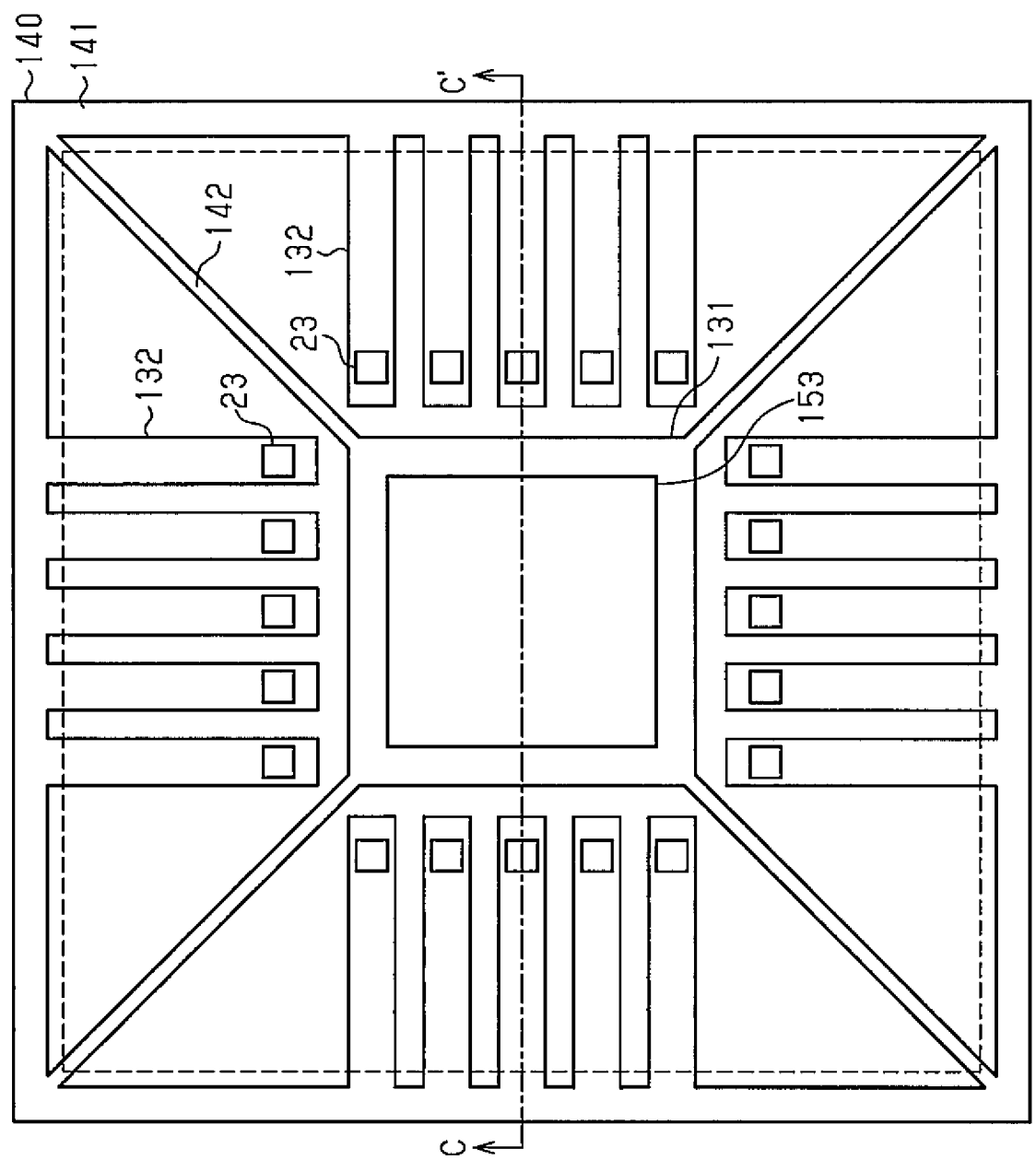

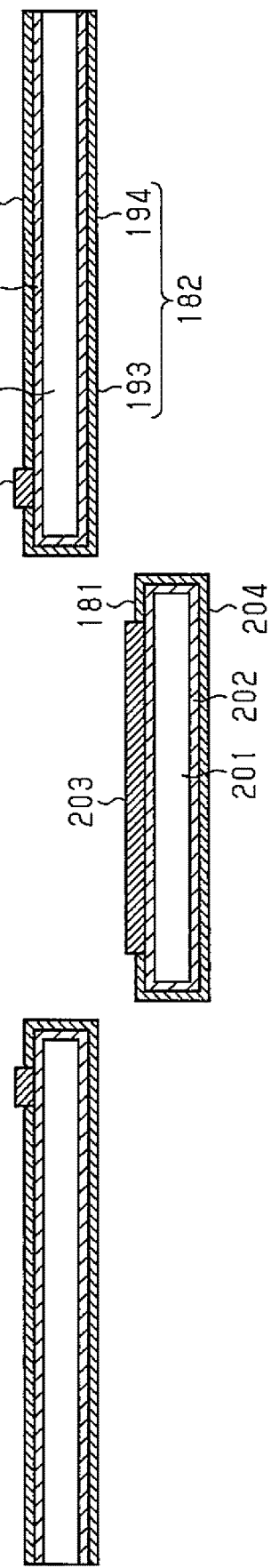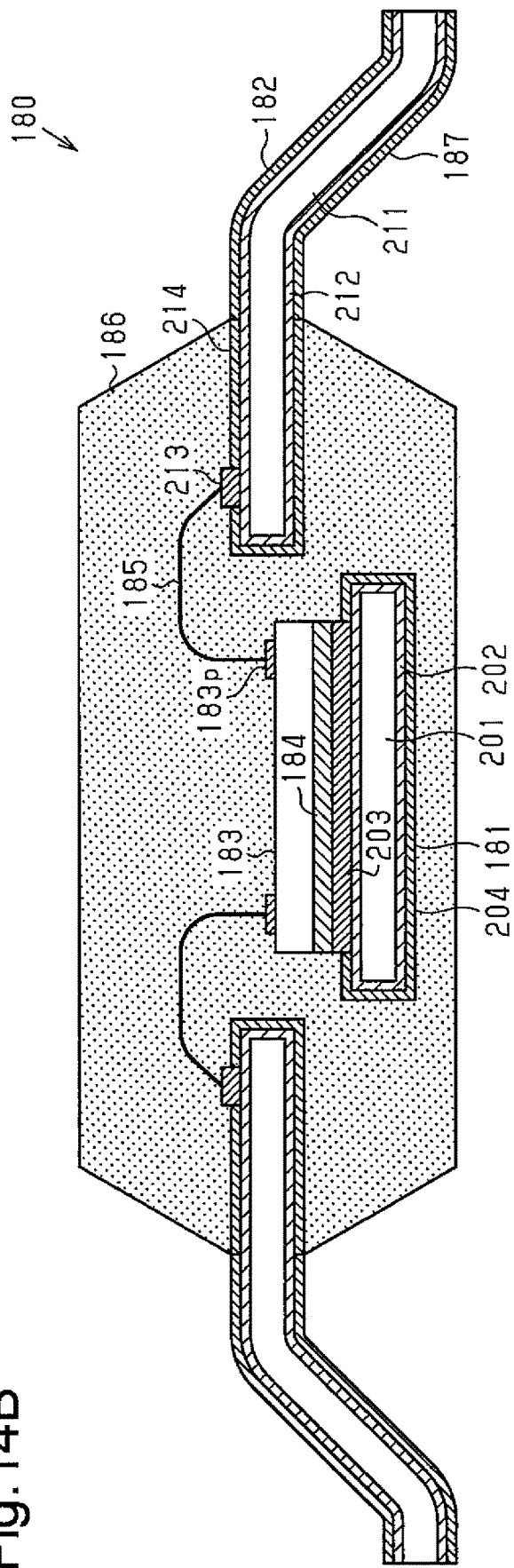
Fig. 14A
Fig. 14B

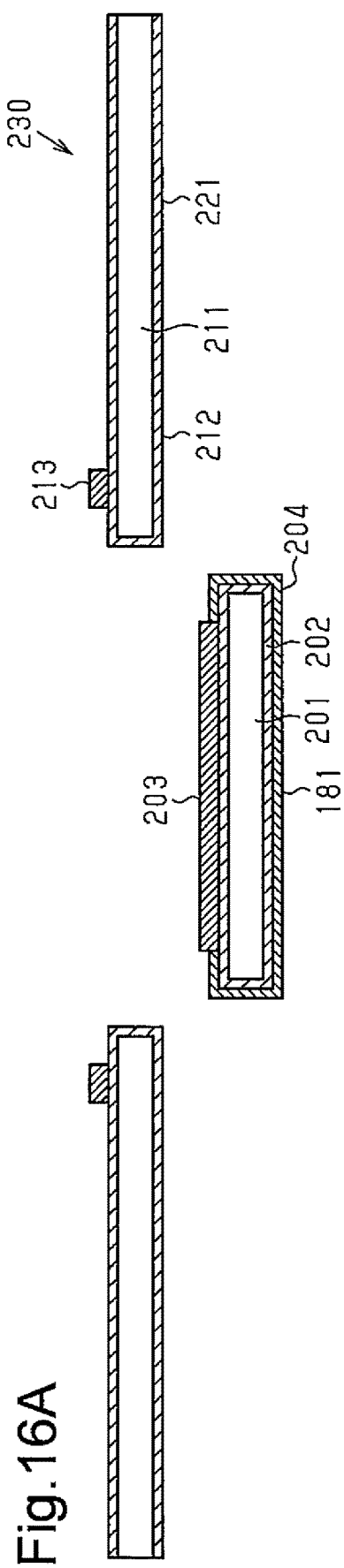
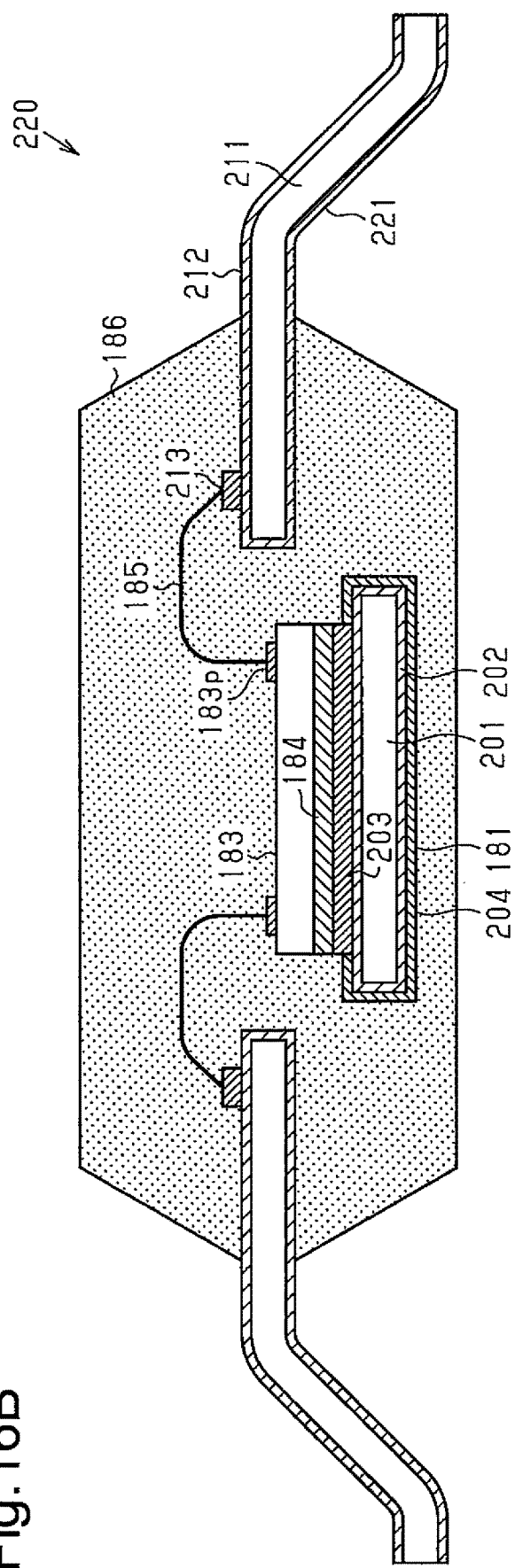

LEAD FRAME AND SEMICONDUCTOR DEVICE

CROSS-REFERENCE TO RELATED APPLICATIONS

This application is based upon and claims the benefit of priority from prior Japanese Patent Application No. 2017-223851, filed on Nov. 21, 2017, the entire contents of which are incorporated herein by reference.

FIELD

This disclosure relates to a lead frame, a semiconductor device, and a method for manufacturing a lead frame.

BACKGROUND

A lead frame for semiconductor devices is used to mount a semiconductor device on a substrate or the like. Japanese Laid-Open Patent Publication Nos. 2004-349497 and 2004-332105 describe lead frames in the related art. In a semiconductor device, a semiconductor element is mounted on a lead frame and encapsulated together with the lead frame in a resin material. In this case, for example, the surface of the lead frame is roughened to increase the adhesion between the lead frame and the resin material.

SUMMARY

When solder is used to mount a semiconductor element on a lead frame that has undergone a roughening process, the roughening process may cause the solder to wet and spread outside the desired region. Such wetting and spreading of solder may cause the semiconductor element to be misaligned with the lead frame. Thus, the wetting and spreading of solder needs to be limited.

One embodiment of a lead frame includes a conductive member, a plating layer, and an oxide film. The conductive member includes a rough surface. The plating layer is formed on the rough surface and configured to be connected to a semiconductor element. The oxide film covers the rough surface at least around the plating layer.

One embodiment of a semiconductor device includes a semiconductor element and a lead. The semiconductor element includes an electrode. The lead includes a conductive member, a plating layer, and an oxide film. The conductive member includes a rough surface. The plating layer is formed on the rough surface. The oxide film covers the rough surface at least around the plating layer. The semiconductor device further includes solder connecting the electrode to the plating layer. The semiconductor device further includes an encapsulation resin covering the semiconductor element, the solder, and part of the lead.

Another embodiment of a semiconductor device includes a semiconductor element, a lead, and a die pad. The semiconductor element includes an electrode. The die pad includes a conductive member, a plating layer, and an oxide film. The conductive member includes a rough surface. The plating layer is formed on the rough surface. The oxide film covers the rough surface at least around the plating surface. The semiconductor device further includes solder connecting the semiconductor element and the plating layer and a wire connecting the electrode of the semiconductor element to the lead. The semiconductor device further includes an encapsulation resin covering the semiconductor element, the die pad, the solder, the wire, and part of the lead.

One embodiment of a method for manufacturing a lead frame includes forming a rough surface on a conductive member by performing a roughening process on the conductive member, forming a plating layer configured to be connected to a semiconductor element by performing a plating process on the rough surface, and forming an oxide film covering the rough surface at least around the plating layer by performing an oxidation process on the rough surface at least around the plating layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view of a lead frame;

FIG. 1B is a schematic cross-sectional view of a semiconductor device including a lead formed in the lead frame illustrated in FIG. 1A;

FIGS. 6A to 6C, 7A, and 7B are schematic cross-sectional views illustrating steps of manufacturing a lead frame;

FIGS. 8A, 8B, 9A, and 9B are schematic cross-sectional views illustrating steps of manufacturing a semiconductor device;

FIG. 10A is a schematic cross-sectional view illustrating a modified example of a lead frame;

FIG. 10B is a schematic cross-sectional view of a semiconductor device including a lead formed in the lead frame illustrated in FIG. 10A;

FIG. 11A is a schematic cross-sectional view illustrating another modified example of a lead frame;

FIG. 11B is a schematic cross-sectional view of a semiconductor device including a lead formed in the lead frame illustrated in FIG. 11A;

FIG. 12 is a schematic plan view of the lead frame illustrated in FIG. 11A;

FIG. 14A is a schematic cross-sectional view illustrating another modified example of a lead frame;

FIG. 14B is a schematic cross-sectional view of a semiconductor device including a lead formed in the lead frame illustrated in FIG. 14A;

FIG. 16A is a schematic cross-sectional view illustrating another modified example of a lead frame;

FIG. 16B is a schematic cross-sectional view of a semiconductor device including a lead formed in the lead frame illustrated in FIG. 16A.

DESCRIPTION OF THE EMBODIMENTS

Figure 2:
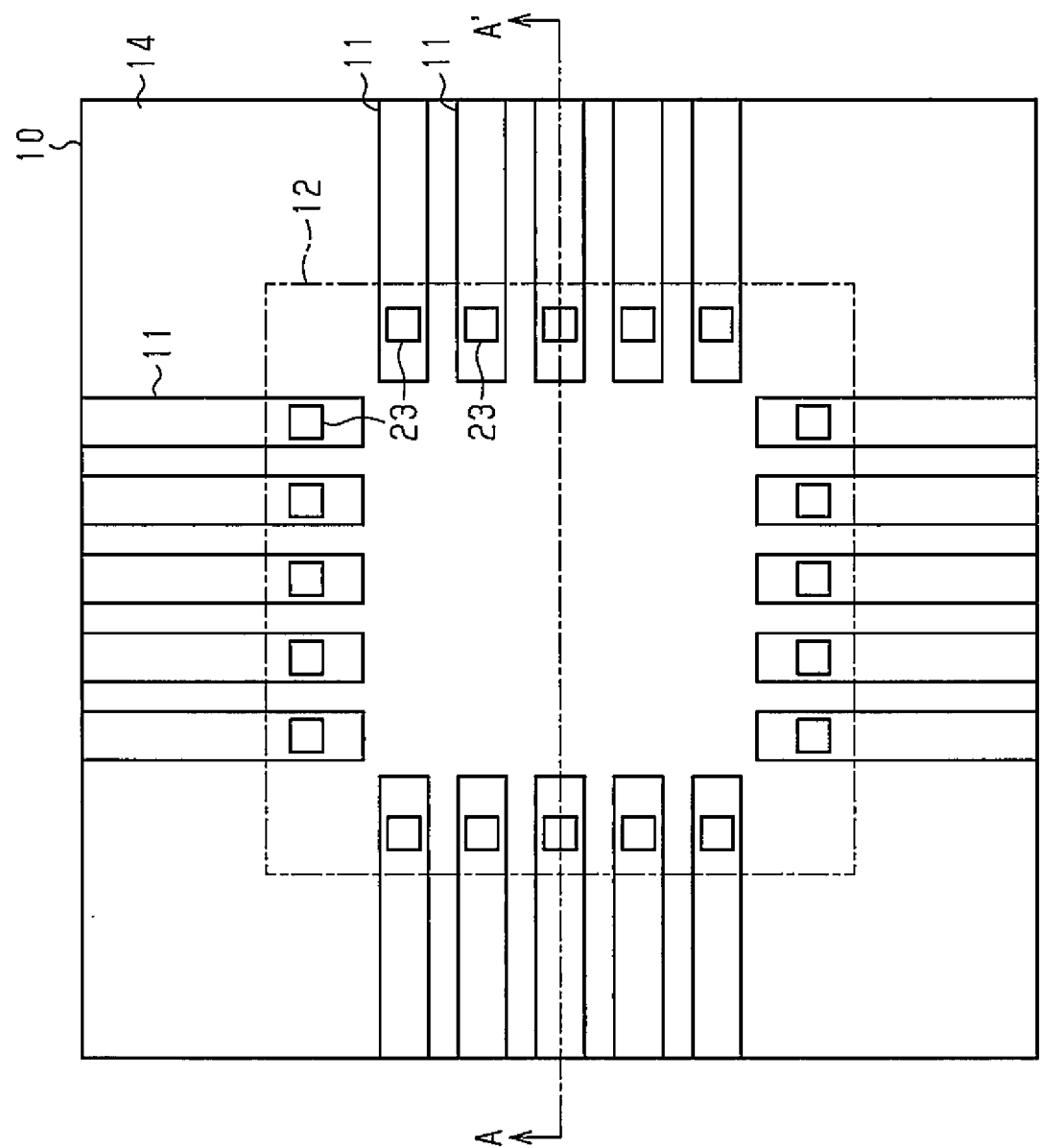
FIG. 2 is a schematic plan view of the semiconductor device illustrated in FIG. 1B.

Embodiments will now be described with reference to the accompanying drawings. Elements in the drawings may be partially enlarged for simplicity and clarity and thus have not necessarily been drawn to scale. To facilitate understanding of cross-sectional structures, hatching lines may be replaced by discrete dots or may not be illustrated in the cross-sectional drawings.

A semiconductor device 10 will now be described. FIG. 1B is a cross-sectional view of the semiconductor device 10 taken along line A-A' in FIG. 2. As illustrated in FIGS. 1B and 2, the semiconductor device 10 generally includes a plurality of leads 11, a semiconductor element 12, solder 13, an encapsulation resin 14, and an external plating layer 15. FIGS. 1B and 2 illustrate an example of the semiconductor device 10 of a quad flat non-leaded (QFN) package. The semiconductor device 10 may be shaped as a generally tetragonal plate in a plan view.

As illustrated in FIG. 2, the leads 11 are arranged along each side of the semiconductor device 10. In FIG. 2, which illustrates a schematic plan view of the semiconductor device 10, the leads 11 are indicated by the solid lines, and the semiconductor element 12 is indicated by the single-dashed lines.

Each of the leads 11 has an inner end portion including a plating layer 23. The plating layer 23 is provided to mount the semiconductor element 12 on the lead 11. For example, a silver (Ag) plating may be used as the plating layer 23. Alternatively, the plating layer 23 may be, for example, a nickel (Ni) plating, a palladium (Pd) plating, a gold (Au) plating, or a laminated body of multiple plating layers (e.g., Ni plating layer and Ag plating layer). Alternatively, the plating layer 23 may be formed, for example, by sequentially stacking an Ni plating layer and an Au plating layer on a rough-surface plating layer 22. The rough-surface plating layer 22 will be described later. Alternatively, the plating layer 23 may be formed by sequentially stacking an Ni plating layer, a Pd plating layer, and an Au plating layer on the rough-surface plating layer 22.

As illustrated in FIG. 1B, the lead 11 includes an outer connector 11o and an inner connector 11i located at an inner side of the outer connector 11o. The inner connector 11i is thinner than the outer connector 11o. Thus, the lead 11 has a stepped side surface.

The semiconductor element 12 includes electrodes 12p. The electrodes 12p are flip-chip-connected (FC-connected) to the plating layer 23 of the leads 11 by the solder 13. The solder 13 includes, for example, solder bumps (solder balls) mounted on the electrodes 12p of the semiconductor element 12. Alternatively, the solder 13 may include a solder paste applied to the electrodes 12p of the semiconductor element 12 and a surface of the plating layer 23 of the leads 11. For example, solder that contains tin (Sn) such as Sn—Ag solder, Au—Sn solder, or Pb—Sn solder may be used as the solder 13.

The semiconductor element 12, the solder 13, and part of the lead 11 are encapsulated by the insulative encapsulation resin 14. The lead 11 is exposed in a side surface 14b and a lower surface 14c of the encapsulation resin 14. In the present example, the encapsulation resin 14 covers upper and side surfaces of the outer connector 11o and the entire surface (upper, side, lower surfaces) of the inner connector 11i.

For example, an epoxy resin, a polyimide resin, a phenol resin, or a vinyl chloride resin may be used as the encapsulation resin 14. The lead 11 may include the external plating layer 15 covering a lower surface of the outer end portion (outer connector 11o). The external plating layer 15 is used to mount the semiconductor device 10 on a circuit board (not illustrated) or the like. The external plating layer 15 is exposed from the encapsulation resin 14. For example, a tin (Sn) plating may be used as the external plating layer 15. Alternatively, at least one of, for example, Sn, silver (Ag), zinc (Zn), and bismuth (Bi) may be used as the material of the external plating layer 15.

Figure 3:
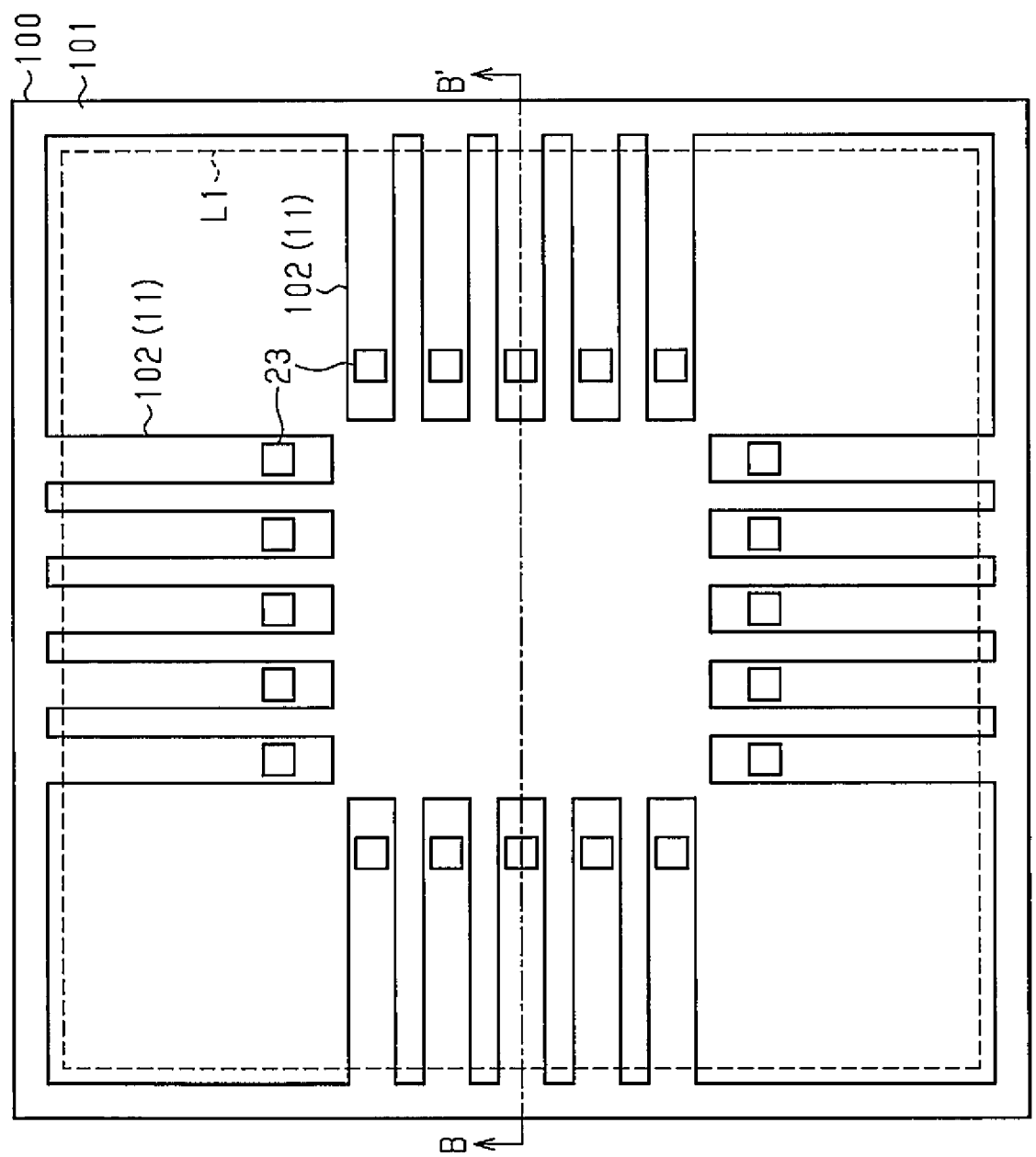
FIG. 3 is a schematic plan view of the lead frame illustrated in FIG. 1A.

FIGS. 1A and 3 illustrate a lead frame 100 used to form the semiconductor device 10. FIG. 1A is a cross-sectional view of the lead frame 100 taken along line B-B' in FIG. 3. As illustrated in FIG. 3, the lead frame 100 includes a frame portion 101 and a plurality of lead portions 102 supported by the frame portion 101. FIG. 1A is a vertical cross-sectional view of the lead frame 100 taken in the longitudinal direction of the lead portions 102. FIG. 1A illustrates cross sections of the lead portions 102 and does not illustrate the frame portion 101.

As illustrated in FIG. 3, the frame portion 101 is shaped as a generally tetragonal frame. The lead portions 102 extend inward from the frame portion 101 and orthogonal to the frame portion 101. When the lead portions 102 are cut in the cutting position indicated by broken lines L1, the leads 11 illustrated in FIG. 1B are formed. In the description hereafter, the "lead portion" (lead portion 102) may be referred to as the "lead" (lead 11). FIG. 3 illustrates a portion of the lead frame 100, or a unit lead frame, used to form a single semiconductor device 10.

The lead frame 100 may include a plurality of unit lead frames. The unit lead frames are arranged, for example, in a matrix. When the lead frame 100 including the plurality of unit lead frames is used, a plurality of semiconductor devices 10 are simultaneously formed. After a plurality of semiconductor elements 12 are mounted on the lead frame 100 and encapsulated by the encapsulation resin 14, each semiconductor device 10 (refer to FIG. 1B) is singulated.

As illustrated in FIG. 1A, the leads 11 of the lead frame 100 include a base 21, the rough-surface plating layer 22, the plating layer 23, and an oxide film 24.

The base 21 includes an upper surface 21a and a lower surface 21b. The upper surface 21a and the lower surface 21b extend from the frame portion 101 (refer to FIG. 3) toward a central portion. As illustrated in FIG. 1A, the upper surface 21a has a greater dimension than the lower surface 21b in the longitudinal direction. For example, each base 21 has an inner end portion that is thinned from a lower surface side. The base 21 is electrically conductive. For example, a metal such as copper (Cu,) a Cu alloy, or Alloy 42 (alloy of iron and nickel) may be used as the material of the base 21.

The rough-surface plating layer 22 covers a surface of the base 21. In the example illustrated in FIG. 1A, the rough-surface plating layer 22 covers the entire surface of the base 21. When the lead frame 100 on which the semiconductor element 12 is mounted is cut in the cutting position L1 to form the semiconductor device 10, the cut end surface of the base 21 is exposed from the encapsulation resin 14 (refer to FIG. 1B). The rough-surface plating layer 22 has a surface that is roughened to be a rough surface. The rough-surface plating layer 22 including the rough surface may be formed through a roughening process. For example, copper (Cu) may be used as the material of the rough-surface plating layer 22. The thickness of the rough-surface plating layer 22 (e.g., rough copper plating) may be, for example, 0.5 µm to 2.0 µm.

The plating layer 23 is formed on an upper surface 22a (rough surface) of the rough-surface plating layer 22. As described above, the plating layer 23 is used to be connected to the semiconductor element 12. For example, a silver (Ag) plating or a palladium (Pd) plating may be used as the plating layer 23. The thickness of the plating layer 23 (e.g., silver plating layer) may be, for example, 0.3 µm to 15 µm.

The oxide film 24 covers a surface (rough surface) of the rough-surface plating layer 22. In the example illustrated in FIG. 1A, the oxide film 24 covers the entire surface of the rough-surface plating layer 22 excluding the plating layer 23. As described above, the rough-surface plating layer 22 covers the entire surface of the base 21. Although not illustrated in the drawings, the rough-surface plating layer 22 also covers longitudinal side surfaces of the base 21. Thus, although not illustrated in the drawings, the oxide film 24 covers longitudinal side surfaces of the rough-surface plating layer 22. The thickness of the oxide film 24 (e.g., copper oxide coating) may be, for example, 0.03 µm to 0.3 µm.

In the lead frame 100 illustrated in FIG. 1A, the oxide film 24 covers the rough-surface plating layer 22 on the lower surface 21b of the base 21 (lower surface of portion corresponding to the outer connector 11o). However, in the semiconductor device 10 illustrated in FIG. 1B, the oxide film 24 is removed from the leads 11 at the lower surface 21b of the base 21. In a step of forming the semiconductor device 10 using the lead frame 100, the oxide film 24 is removed from the lower surface 21b of the base 21, which will be described later.

The oxide film 24 is an oxide coating formed by oxidizing the surfaces of the rough-surface plating layer 22. When the rough-surface plating layer 22 is copper, the oxide film 24 is a copper oxide coating. The copper oxide coating includes, for example, copper(I) oxide ($Cu_2O$) as the main component and copper(II) oxide (CuO). The oxide film 24 includes, for example, copper(II) hydroxide ($Cu(OH)_2$) as a hydroxide. The oxide film 24 is a copper oxide coating having acicular crystals. The acicular crystals have grain diameters of approximately 0.5 µm or smaller. The oxide film 24 having such configurations limits solder wetting.

The oxide film 24 having acicular crystals produces an anchor effect on the encapsulation resin 14 covering the oxide film 24.

Additionally, the oxide film 24 including a hydroxide produces strong adhesion by bonding to the encapsulation resin 14. To produce a sufficient bonding force, a resin including molecules having a hydroxyl group may be used as the encapsulation resin 14. For example, an epoxy resin, a polyimide resin, a phenol resin, or a vinyl chloride resin may be used as the encapsulation resin 14 having such configurations. The hydroxide of the oxide film 24 produces a strong bonding force by hydrogen bonding to the hydroxyl group of the encapsulation resin 14.

Figure 4:
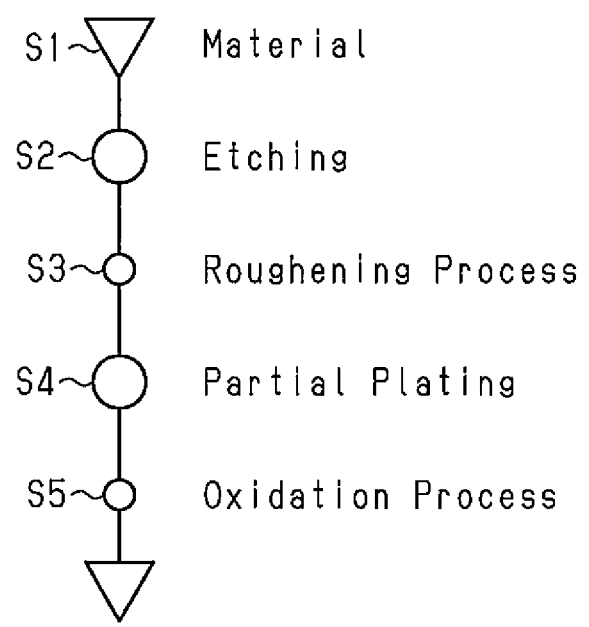
FIG. 4 is a diagram illustrating steps of manufacturing a lead frame.

The step of forming the lead frame 100 will now be described with reference to FIG. 4.

In step S1, a metal plate is prepared to form the base 21 illustrated in FIG. 1A as the material of the lead frame 100. For example, copper (Cu), a copper alloy, or Alloy 42 (alloy of iron and nickel) may be used as the material of such a metal plate.

In step S2, etching is performed to form the base 21. An etchant used in etching may be appropriately selected in accordance with the material of the metal plate. For example, when a copper plate is used as the metal plate, a ferric chloride solution or a copper(II) chloride solution may be used as the etchant. For example, spray etching may be performed on opposite surfaces of the metal plate to form the base 21.

In step S3, a roughening process is performed to form a rough surface. In the present example, the roughening process is performed to form the rough-surface plating layer 22 (refer to FIG. 1A) on the base 21. The rough-surface plating layer 22 may be formed through a rough plating process (e.g., copper rough plating process). The rough plating process may be, for example, a polarity reversal electrolysis. In the polarity reversal electrolysis, for example, a polarity reversal electrode is connected between a work immersed in a plating solution and an electrode opposed to one of the main surfaces of the work. Also, a direct current power supply is connected between the work and an electrode opposed to the other main surface of the work. The polarity reversal electrode and the direct current power supply are used to apply current to the work and each electrode so that a plating process is simultaneously performed on the two main surfaces of the work.

When a positive pulse current is supplied from the polarity reversal electrode to the work, a plating film partially having a bad adhesion is formed on the main surfaces of the work. When the polarity of the current is reversed to supply a negative pulse current to the work, an anodic electrolysis is performed on the plating film formed on the main surfaces of the work, and only the bad adhesive portion of the plating film dissolves. Repetition of this forms a plating film having a rough surface (rough-surface plating layer 22). As described above, through the process of steps S1 to S3, a conductive member including a rough surface (in the present example, the base 21 and the rough-surface plating layer 22) is formed.

The plating solution may include, for example, cupric sulfate: 200 g/L, sulfuric acid: 100 g/L, chlorine: 50 ppm, brightener (manufactured by Rohm & Hass, product name: MICROFILL™ EVF): 2 ml/L, leveler (manufactured by Rohm & Hass, product name: MICROFILL™ EVF): 10 ml/L, and polymer (manufactured by Rohm & Hass, product name: MICROFILL™ EVF): 20 ml/L. The conditions of the process may be, for example, bath temperature: approximately 20° C., process time: approximately 120 seconds, and current density: approximately 1 A/dm².

A rough surface may be formed on the conductive member through a rough etching process. For example, the rough etching process is performed on the surface of the base 21 illustrated in FIG. 1A to form a rough surface on the base 21. The etchant may be, for example, an acidic solution such as a piranha solution (mixed solution of sulfuric acid and hydrogen peroxide water) or an etchant of, for example, a formic or acetic acid type. In this case, the etchant is sprayed onto the base 21 to etch the surface of the base 21 and form a rough surface.

The state of the rough surface may be determined, for example, through roughness measurement using an atomic force microscope (AFM). In the roughness measurement, for example, an arithmetic average roughness Sa, a maximum height P-V, and a surface area ratio Sratio are measured. The arithmetic average roughness Sa is an average value of differences (absolute values) in height between the average surface height and each point. The maximum height P-V is the maximum value of the height differences at the points. When a rough surface having a surface area S is formed on a flat surface having a surface area $S_0$, the surface area ratio Sratio is the ratio $S/S_0$ of the surface area S to the surface area $S_0$.

Before the metal plate (Cu) is processed, for example, Sa=60 nm, P-V=380 nm, and Sratio=1.08. When the rough surface is obtained through a rough etching process, for example, Sa=180 nm, P-V=1510 nm, and Sratio=1.6. When the rough surface is obtained through a copper rough plating process, Sa=340 nm, P-V=2200 nm, and Sratio=2.2. The preferred range of the surface area ratio Sratio of the rough surface is 1.1 to 4.0.

In step S4, a partial plating process is performed to form the plating layer 23 (refer to FIG. 1A). The plating layer 23 may be formed, for example, through electrolytic plating or electroless plating. For example, the rough surface formed on the lead frame 100 through a roughening process (rough-surface plating layer 22 in the example illustrated in FIG. 1A) is covered with a resist film including openings where the plating layer 23 will be formed. Then, a plating metal is deposited on the rough surface from the openings in the resist film to form the plating layer 23. Subsequently, the resist film is removed.

In step S5, an oxidation process is performed to form the oxide film 24 (refer to FIG. 1A). The oxidation process may be, for example, a forced oxidation process. In the forced oxidation process, for example, an anodic oxidation process is performed with the lead frame immersed in a blackening treatment solution. The blackening treatment solution is, for example, a mixed solution of a strong alkali compound and an oxidizing agent. The strong alkali compound may be, for example, sodium hydroxide, potassium hydroxide, or a combination of the two compounds or more. The oxidizing agent may be, for example, sodium chlorite. Any additive may be additionally used.

The blackening treatment solution may include, for example, sodium chlorite ($NaClO_2$): 0 to 100 g/L, sodium hydroxide (NaOH): 5 to 60 g/L, and trisodium phosphate ($Na_3PO_4$): 0 to 200 g/L. The conditions of the process may be, for example, bath temperature: approximately 50° C. to 80° C., process time: approximately 1 to 20 seconds, and cathode current density: approximately 0.2 to 10 $A/cm^2$.

Figure 5A:
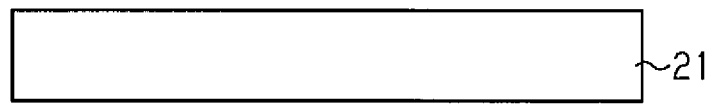
FIG. 5A is a schematic cross-sectional view illustrating a base of a lead.
Figure 5B:
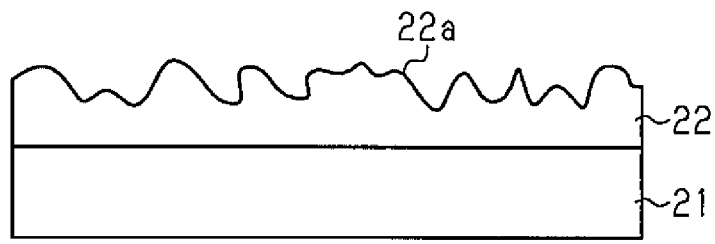
FIG. 5B is a schematic cross-sectional view illustrating a rough-surface plating layer formed through a roughening process.
Figure 5C:
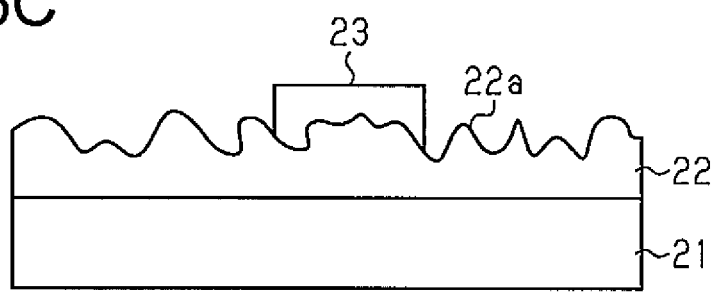
FIG. 5C is a schematic cross-sectional view illustrating a plating layer formed through a partial plating process.
Figure 5D:
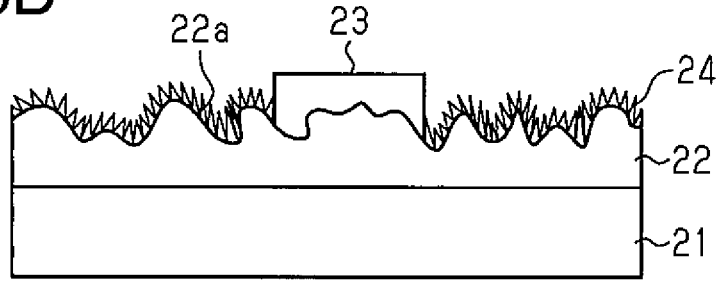
FIG. 5D is a schematic cross-sectional view illustrating an oxide film formed through an oxidation process.

FIG. 5A illustrates the base 21. When the roughening process described above is performed on the base 21, the rough-surface plating layer 22 including the rough surface 22a is formed on the base 21 as illustrated in FIG. 5B. When the partial plating process described above is performed on the rough surface 22a of the rough-surface plating layer 22, the plating layer 23 is partially formed on the rough-surface plating layer 22 (rough surface 22a) as illustrated in FIG. 5C. Subsequently, the oxidation process described above is performed on the rough surface 22a of the rough-surface plating layer 22 to form the oxide film 24 covering the rough surface 22a as illustrated in FIG. 5D. The oxide film 24 has acicular crystals. The oxide film 24 is formed in conformance with irregularities of the rough surface 22a of the rough-surface plating layer 22.

The state of the surface of the oxide film 24 may be observed, for example, with an electron microscope. The surface of the oxide film 24 has an infinite number of acicular projections having a sharp distal end derived from the plating metal of the rough-surface plating layer 22. The acicular projections function as an anchor to the encapsulation resin 14 (refer to FIG. 1B). The acicular projections may have various forms and typically have the form of a triangular pyramid, a matte form, or a feather-like form. It is preferred that the acicular projections be distributed to the entire covering surface (oxide film 24). However, the acicular projections may be distributed to only a substantial portion of the covering surface (for example, area of approximately 80% or more of covering surface) as long as the desired effect is obtained. The term "acicular projections" does not require that all of the projection be acicular, and some of the projections may have a round distal end as long as the desired effect is obtained. The acicular crystal structure of the plating metal increases the bonding area in addition to producing the anchor effect.

The steps of manufacturing the semiconductor device 10 will now be described. The steps of manufacturing the lead frame 100 will also be described.

In the step illustrated in FIG. 6A, a metal plate 51 is prepared. The material of the metal plate 51 may be, for example, a metal such as copper (Cu), a Cu alloy, or Alloy 42. The thickness of the metal plate 51 may be, for example, approximately 100 μm to 250 μm. The broken lines L1 illustrated in 6A indicate the cutting positions to obtain the singulated semiconductor device 10 illustrated in FIG. 1B.

In the step illustrated in FIG. 6B, the base 21 is formed. For example, an etching resist including openings conforming to the shape of the base 21 is formed on the metal plate 51 illustrated in FIG. 6A. The portion of the metal plate 51 exposed in the openings of the etching resist is etched to obtain the base 21. Subsequently, the etching resist is removed. When copper (Cu) or a Cu alloy is used as the material of the metal plate 51, a ferric chloride solution or a copper(II) chloride solution may be used as the etchant. In this case, spray etching may be performed on opposite surfaces of the metal plate 51. The material of the etching resist is not particularly limited as long as the material has a desired resolution and resistance to etching. Instead of etching the metal plate 51, the base 21 may be formed by stamping the metal plate 51.

In the step illustrated in FIG. 6C, the rough-surface plating layer 22 is formed on the surface of the base 21 (here, entire surface of base 21). The rough-surface plating layer 22 may be formed through a roughening process. The roughening process may be, for example, a rough plating process that uses a polarity reversal electrolysis. In the polarity reversal electrolysis, for example, a polarity reversal electrode is connected between a work immersed in a plating solution and an electrode opposed to one of the main surfaces of the work. Also, a direct current power supply is connected between the work and an electrode opposed to the other main surface of the work. The polarity reversal electrode and the direct current power supply are used to apply current to the work and each electrode so that a plating process is simultaneously performed on the two main surfaces of the work.

When a positive pulse current is supplied from the polarity reversal electrode to the work, a plating film partially having a bad adhesion is formed on the main surfaces of the work. When the polarity of the current is reversed to supply a negative pulse current to the work, an anodic electrolysis is performed on the plating film on the main surfaces of the work, and only the bad adhesive portion of the plating film dissolves. Repetition of this forms a plating film having a rough surface (rough-surface plating layer 22).

The plating solution may include, for example, cupric sulfate: 200 g/L, sulfuric acid: 100 g/L, chlorine: 50 ppm, brightener (manufactured by Rohm & Hass, product name: MICROFILL™ EVF): 2 ml/L, leveler (manufactured by Rohm & Hass, product name: MICROFILL™ EVF): 10 ml/L, and polymer (manufactured by Rohm & Hass, product name: MICROFILL™ EVF): 20 ml/L. The conditions of the process may be, for example, bath temperature: approximately 20° C., process time: approximately 120 seconds, and current density: approximately 1 A/dm$^2$.

Figure 7A:
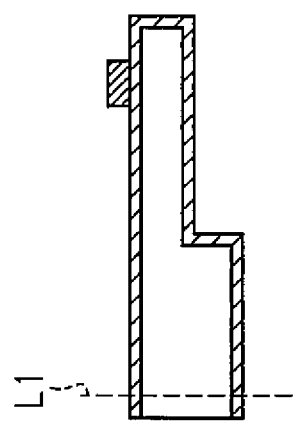

In the step illustrated in FIG. 7A, the plating layer 23 is formed. The plating layer 23 is, for example, a silver (Ag) plating. The plating layer 23 may be formed, for example, through electrolytic plating or electroless plating. For example, the rough surface (rough-surface plating layer 22) is covered with a resist film having openings where the plating layer 23 will be formed. Then, a plating metal is deposited on the rough surface from the openings in the resist film to form the plating layer 23 on the rough-surface plating layer 22. Subsequently, the resist film is removed, for example, by an alkaline solution.

Figure 7B:
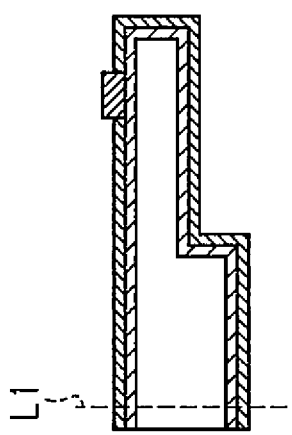

In the step illustrated in FIG. 7B, the oxide film 24 is formed on the surface (rough surface) of the rough-surface plating layer 22. The oxide film 24 is formed by performing an oxidation process on the surface of the rough-surface plating layer 22. The oxidation process may be, for example, a forced oxidation process that performs an anodic oxidation process with the lead frame immersed in a blackening treatment solution. The blackening treatment solution is, for example, a mixed solution of a strong alkali compound and an oxidizing agent. The strong alkali compound may be, for example, sodium hydroxide, potassium hydroxide, or a combination of the two compounds or more. The oxidizing agent may be, for example, sodium chlorite. Any additive may be additionally used.

The blackening treatment solution may include, for example, sodium chlorite ($NaClO_2$): 0 to 100 g/L, sodium hydroxide (NaOH): 5 to 60 g/L, and trisodium phosphate ($Na_3PO_4$): 0 to 200 g/L. The conditions of the process may be, for example, bath temperature: approximately 50° C. to 80° C., process time: approximately 1 to 20 seconds, and cathode current density: approximately 0.2 to 10 A/cm$^2$.

In the step illustrated in FIG. 8A, the semiconductor element 12 is mounted on the leads 11. For example, the solder 13 is applied to at least one of the plating layer 23 of the lead frame 100 and the electrodes 12$p$ of the semiconductor element 12. In this case, the solder 13 may be applied using solder balls. After the electrodes 12$p$ are aligned with the plating layer 23, the solder 13 is melted and cured through a reflow process. This bonds the semiconductor element 12 to the leads 11.

In the step illustrated in FIG. 8B, the encapsulation resin 14 is formed to cover the semiconductor element 12, the solder 13, and part of the leads 11. The encapsulation resin 14 may be formed, for example, through transfer molding, compression molding, or injection molding.

Figure 9A:
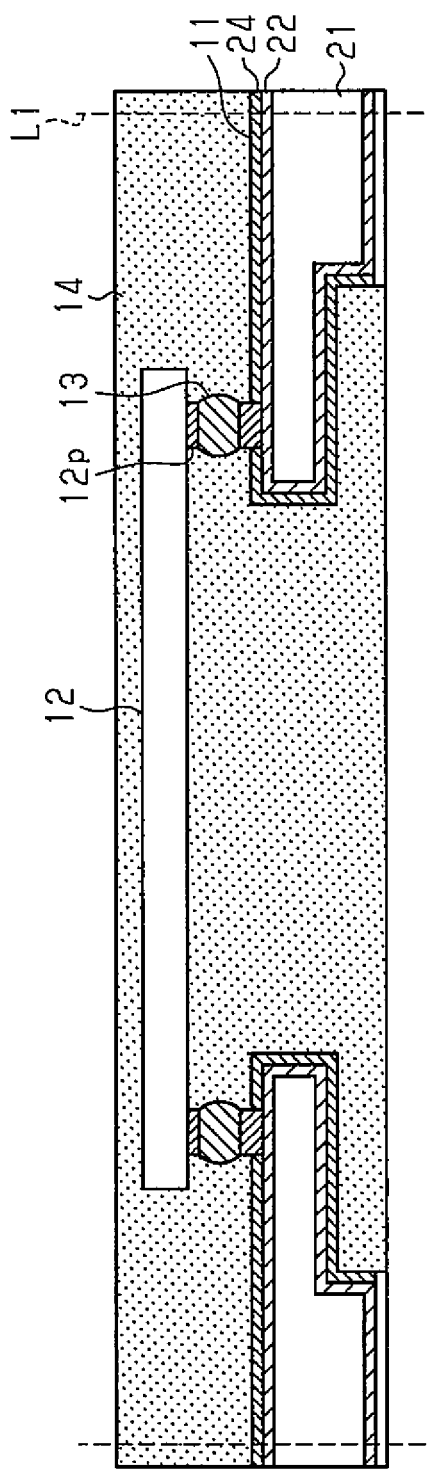

In the step illustrated in FIG. 9A, in pre-processing, the oxide film exposed from the encapsulation resin 14 (in FIG. 8B, oxide film 24$x$ exposed in lower surface of encapsulation resin 14) is removed. In this preprocessing, an acid process or an alkaline process may be used.

Figure 9B:
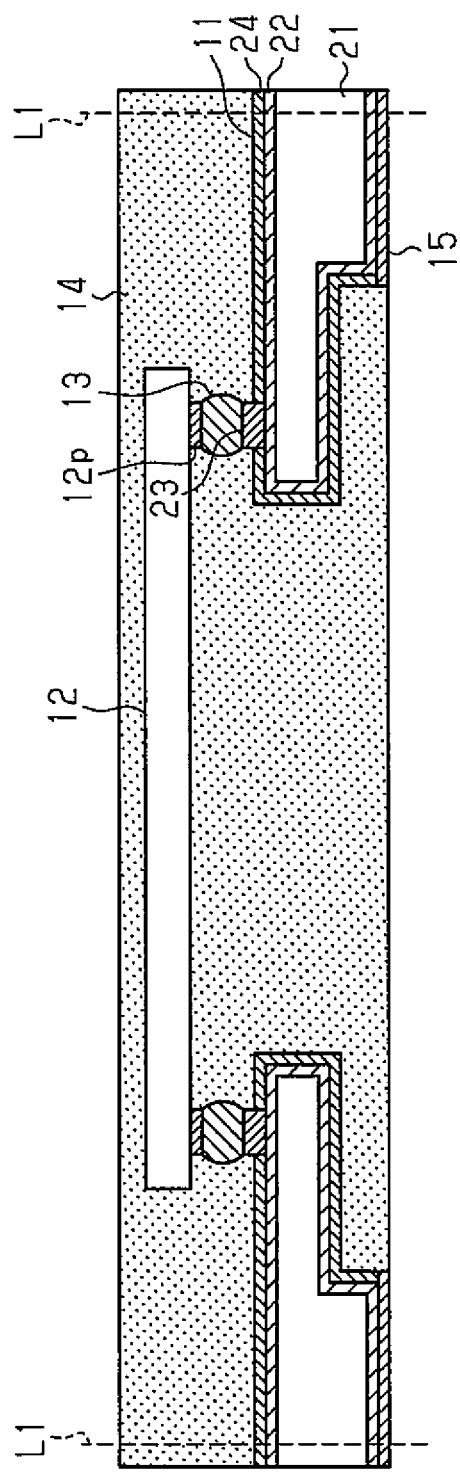

In the step illustrated in FIG. 9B, the external plating layer 15 is formed on the portion of the leads 11 exposed from the encapsulation resin 14. The external plating layer 15 may be formed, for example, through electrolytic plating or electroless plating. Subsequently, in a singulation process, cutting is performed in the cutting position L1, and the semiconductor device 10 illustrated in FIG. 1B is obtained.

The operations of the lead frame 100 and the semiconductor device 10 will now be described.

The oxide film 24 covers the rough surface of the rough-surface plating layer 22 excluding the plating layer 23. The rough-surface plating layer 22 covers the entire surface of the base 21. Although not illustrated in the drawings, the rough-surface plating layer 22 also covers the longitudinal side surfaces of the base 21. Thus, although not illustrated in the drawings, the oxide film 24 covers the longitudinal side surfaces of the rough-surface plating layer 22. The oxide film 24 is an oxide coating including a hydroxide (e.g., copper oxide coating) and has acicular crystals.

The rough-surface plating layer 22 (refer to FIG. 5B) is obtained by performing the above roughening process on the base 21 (refer to FIG. 5A). The oxide film 24 (refer to FIG. 5D) is obtained by performing the above oxidation process on the rough-surface plating layer 22.

As illustrated in FIG. 1B, the semiconductor element 12 is mounted on the lead frame 100 obtained as described above. The electrodes 12$p$ of the semiconductor element 12 are bonded to the plating layer 23 of the lead frame 100 by the solder 13 (e.g., solder balls).

In each lead 11, the oxide film 24 covers the rough surface (rough-surface plating layer 22) around the plating layer 23. In soldering, the oxide film 24 limits wetting and spreading (bleed out) of the solder beyond the necessary region around the plating layer 23. In particular, the oxide film 24 having acicular crystals limits the wettability of solder.

If the oxide film 24 is not provided and the rough surface (rough-surface plating layer 22) is exposed around the plating layer 23, molten solder would wet and spread beyond the necessary region around the plating layer 23 due to the capillary action of the rough surface of the rough-surface plating layer 22. In this regard, the lead 11 of the present embodiment includes the oxide film 24 located around the plating layer 23. Thus, undesirable wetting and spreading of solder is limited.

As illustrated in FIG. 1B, the semiconductor element 12 and part of each lead 11 are covered with the encapsulation resin 14. The anchor effect of the acicular crystals of the oxide film 24 causes the encapsulation resin 14 to strongly adhere to the oxide film 24. This limits separation of the leads 11 from the encapsulation resin 14 and improves the reliability of the semiconductor device 10.

Further, the oxide film 24 includes a hydroxide. When the encapsulation resin 14 is cured, the hydroxide of the oxide film 24 is hydrogen-bonded to a hydroxyl group included in the encapsulation resin 14. The hydrogen bonding causes the encapsulation resin 14 to strongly adhere to the oxide film 24. This limits separation of the leads 11 from the encapsulation resin 14 and improves the reliability of the semiconductor device 10.

The lead frame 100 (leads 11) of the present embodiment includes the rough-surface plating layer 22 including the rough surface and the oxide film 24 covering the rough-surface plating layer 22. The rough-surface plating layer 22 and the oxide film 24 produce synergy that increases the adhesion between the encapsulation resin 14 and the leads 11. For example, a "lead frame including only a rough-surface plating layer having a rough surface" is compared with a "lead frame further including an oxide film formed on a rough-surface plating layer having a rough surface" to determine the adhesion (shear strength) between the lead frame and an encapsulation resin. In this case, the adhesion (shear strength) of the "lead frame further including an oxide film formed on a rough-surface plating layer having a rough surface" is approximately 20% higher than that of the "lead frame including only a rough-surface plating layer having a rough surface."

The present embodiment has the advantages described below.

(1) The leads 11 of the lead frame 100 include the base 21, the rough-surface plating layer 22, the plating layer 23, and the oxide film 24. The rough-surface plating layer 22 covers the surface of the base 21. The surface of the rough-surface plating layer 22 is rough. The plating layer 23 is formed on the upper surface 22a (rough surface) of the rough-surface plating layer 22 to be connected to the semiconductor element 12 via the solder 13. The oxide film 24 covers the rough surface of the rough-surface plating layer 22 excluding the plating layer 23. The wettability to the oxide film 24 is lower than that to the rough-surface plating layer 22. In particular, the oxide film 24 has acicular crystals. Since the oxide film 24 having such a configuration covers the rough-surface plating layer 22 around the plating layer 23, wetting and spreading (bleed out) of the solder beyond the necessary region around the plating layer 23 is limited in soldering. This limits misalignment of the semiconductor element 12 connected to the leads 11 by the solder 13.

(2) The semiconductor element 12 and part of each lead 11 are covered with the encapsulation resin 14. The anchor effect of the acicular crystals of the oxide film 24 causes the encapsulation resin 14 to strongly adhere to the oxide film 24. This limits separation of the leads 11 from the encapsulation resin 14 and improves the reliability of the semiconductor device 10.

(3) The oxide film 24 includes a hydroxide. When the encapsulation resin 14 is cured, the hydroxide of the oxide film 24 is hydrogen-bonded to a hydroxyl group included in the encapsulation resin 14. The hydrogen bonding causes the encapsulation resin 14 to strongly adhere to the oxide film 24. This limits separation of the leads 11 from the encapsulation resin 14 and improves the reliability of the semiconductor device 10.

It should be apparent to those skilled in the art that the foregoing embodiments may be implemented in many other specific forms without departing from the scope of this disclosure. Particularly, it should be understood that the foregoing embodiments may be implemented in the following forms.

In the description hereafter, the same reference characters are given to those components that are the same as the corresponding components of the above embodiment. Such components will not be described in detail.

First Modified Example

FIG. 10A illustrates a first modified example of a lead frame 120. FIG. 10B illustrates a semiconductor device 110 using the lead frame 120. The semiconductor device 110 is a semiconductor device of a quad flat non-leaded (QFN) package.

As illustrated in FIG. 10A, the lead frame 120 includes leads 111 including the base 21, the rough-surface plating layer 22, the plating layer 23, and the oxide film 24. In the first modified example, the rough-surface plating layer 22 covers the upper surface 21a, a distal end surface 21c, and longitudinal side surfaces of the base 21. The rough-surface plating layer 22 is formed, for example, by performing a roughening process (copper oxide plating process) with the lower surface of the base 21 (surface on which the rough-surface plating layer 22 will not be formed) masked by a resist film or the like. The oxide film 24 covers the surface (rough surface) of the rough-surface plating layer 22 and the lower surface of the base 21 excluding the plating layer 23. The oxide film 24 is formed by oxidizing the surface (rough surface) of the rough-surface plating layer 22 and the lower surface of the base 21.

As illustrated in FIG. 10B, the semiconductor device 110 includes the plurality of leads 111, the semiconductor element 12, the solder 13, the encapsulation resin 14, and the external plating layer 15. The electrodes 12p of the semiconductor element 12 are connected to the plating layer 23 of the leads 111 by the solder 13. The external plating layer 15 covers the lower surface of the base 21 exposed from the encapsulation resin 14.

In the same manner as the above embodiment, the leads 111 of the first modified example having such configurations limit wetting and spreading of the solder 13 on the leads 111 (oxide film 24) and misalignment of the semiconductor element 12 with the plating layer 23. Additionally, the oxide film 24 limits separation of the encapsulation resin 14 from the leads 111.

Further, the first modified example reduces deficiencies in a manufacturing process or a mounting process. For example, when the rough-surface plating layer 22 is formed on the lower surface of the leads 111, in a resin encapsulation process, the encapsulation resin is easily attached to a lower surface portion (portion where the external plating layer 15 is formed) of the leads 111 used as an external connection terminal. If the encapsulation resin is attached to the lower surface portion of the leads 111, the formation of the external plating layer 15 and the mounting of the semiconductor device 110 will be hindered. In this regard, in the first modified example, the rough-surface plating layer 22 is not formed on the lower surface of the leads 111. Thus, the formation of the external plating layer 15 and the mounting of the semiconductor device 110 are performed in a favorable manner.

Second Modified Example

FIGS. 11A and 12 illustrate a lead frame 140 of a second modified example. FIG. 11A is a cross-sectional view of the lead frame 140 taken along line C-C' in FIG. 12. FIG. 11B illustrates a semiconductor device 130 using the lead frame 140. The semiconductor device 130 is a semiconductor device of a quad flat non-leaded (QFN) package.

As illustrated in FIG. 11B, the semiconductor device 130 includes a die pad 131, a plurality of leads 132, a semiconductor element 133, solder 134, wires 135, an encapsulation resin 136, and external plating layers 137 and 138.

The semiconductor element 133 is mounted on an upper surface of the die pad 131 via the solder 134. The semiconductor element 133 has an upper surface including electrodes 133p. The electrodes 133p are connected to the leads 132 by the wires 135. The wires 135 are formed by, for example, fine wires of gold (Au), copper (Cu), or aluminum (Al). The die pad 131, the semiconductor element 133, the solder 134, the wires 135, and part of each lead 132 are encapsulated by the insulative encapsulation resin 136. The lower surface of the die pad 131 and the lower and end surfaces of each lead 132 are exposed from the encapsulation resin 136. The external plating layer 137 is formed on the lower surface of the die pad 131. The external plating layer 138 is formed on the lower surface of each lead 132. The external plating layers 137 and 138 are the same as the external plating layer 15 of the embodiment and are formed in the same manner as the external plating layer 15.

As illustrated in FIGS. 11A and 12, the lead frame 140 includes a frame portion 141, the die pad 131, the plurality of leads 132, and support bars 142. The frame portion 141 is shaped as a generally tetragonal frame. The die pad 131 is supported by the plurality of (in FIG. 12, four) support bars 142 connected to the frame portion 141 and is located at a center of the frame portion 141. The leads 132 extend from the frame portion 141 toward the die pad 131.

As illustrated in FIG. 11A, each lead 132 includes the base 21, the rough-surface plating layer 22, the plating layer 23, and the oxide film 24.

The die pad 131 includes a base 151, a rough-surface plating layer 152, a plating layer 153, and an oxide film 154. The base 151 includes an upper surface and a lower surface, and each side of the upper surface is longer than the corresponding side of the lower surface. For example, the base 151 has lower outer edges that are thinned from a lower surface side. The material of the base 151 may be, for example, copper (Cu) or a Cu alloy.

In the example illustrated in FIGS. 11A and 11B, the rough-surface plating layer 152 of the die pad 131 covers the entire surface of the base 151. The rough-surface plating layer 152 may be formed through the same roughening process as that forming the rough-surface plating layer 22 of the leads 132. The material of the rough-surface plating layer 152 may be, for example, copper (Cu).

The plating layer 153 partially covers the upper surface (rough surface) of the rough-surface plating layer 152. The size of the plating layer 153 is set in accordance with the size of the semiconductor element 133 (refer to FIG. 11B) mounted on the lead frame 140. For example, a silver (Ag) plating may be used as the plating layer 153. Alternatively, for example, a nickel (Ni) plating, a palladium (Pd) plating, a gold (Au) plating, or a laminated body of multiple plating layers (e.g., Ni plating layer and Ag plating layer) may be used as the plating layer 153. For example, an Ni plating layer and an Au plating layer may be sequentially stacked on the rough-surface plating layer 152 to form the plating layer 153. Alternatively, an Ni plating layer, a Pd plating layer, and an Au plating layer may be sequentially stacked on the rough-surface plating layer 152 to form the plating layer 153.

In the example of the lead frame 140 illustrated in FIG. 11A, the oxide film 154 covers the entire surface (rough surface) of the rough-surface plating layer 152 excluding the plating layer 153. The oxide film 154 (oxide film 154x) is removed from the lower surface of the die pad 131 and the oxide film 24 (oxide film 24x) is removed from the lower surface of each lead 132 in the process for manufacturing the semiconductor device 130 illustrated in FIG. 11B.

In the semiconductor device 130, the semiconductor element 133 is connected by the solder 134 to the plating layer 153 formed on the upper surface of the die pad 131. The oxide film 154 (in the present example, copper oxide coating) covers the die pad 131 excluding the plating layer 153.

The oxide film 154 covers the rough surface (rough-surface plating layer 152) around the plating layer 153. The wettability to the oxide film 154 is lower than that to the rough-surface plating layer 152. Additionally, in the same manner as the above embodiment (oxide film 24), the oxide film 154 has acicular crystals. When the semiconductor element 133 is mounted, the oxide film 154 having such configurations limits wetting and spreading (bleed out) of molten solder (solder 134) beyond the necessary region around the plating layer 153 and misalignment of the semiconductor element 133. Additionally, in the same manner as the above embodiment (oxide film 24), the oxide film 154 includes a hydroxide. The hydrogen bonding of the hydroxide of the oxide film 154 to a hydroxyl group of the encapsulation resin 136 causes the encapsulation resin 136 to strongly adhere to the oxide film 154.

For example, if molten solder (solder 134) widely wets and spreads, the surface tension of the solder 134 may cause the semiconductor element 133 to move or rotate on the upper surface of the die pad 131, resulting in a tilt of the semiconductor element 133 with respect to the die pad 131. In this case, due to movement or inclination of the semiconductor element 133, the wires 135 connected to the leads 132 may fail to be connected (wire-bonded) to the electrodes 133p of the semiconductor element 133.

In this regard, the lead frame 140 illustrated in FIG. 11A limits wetting and spreading of the solder 134 (refer to FIG. 11B) on the die pad 131 (oxide film 154). This limits misalignment of the semiconductor element 133 and allows the wires 135 to be appropriately bonded to the electrodes 133p. In the second modified example, the wires 135 are connected to the plating layer 23 of each lead 132. Thus, the oxide film 24 may be omitted from the leads 132.

Third Modified Example

Figure 13A:
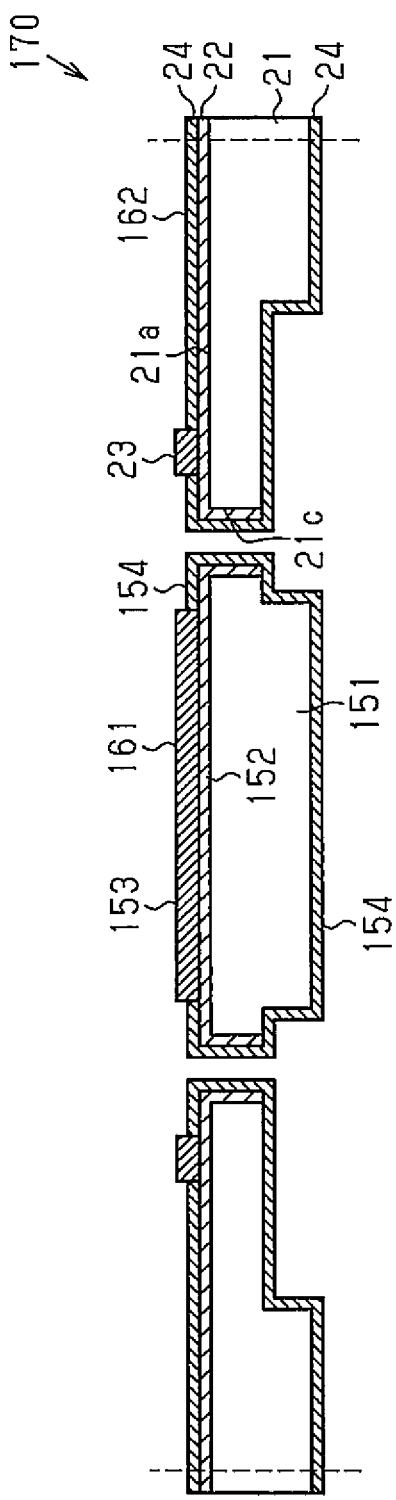
FIG. 13A is a schematic cross-sectional view illustrating another modified example of a lead frame.
Figure 13B:
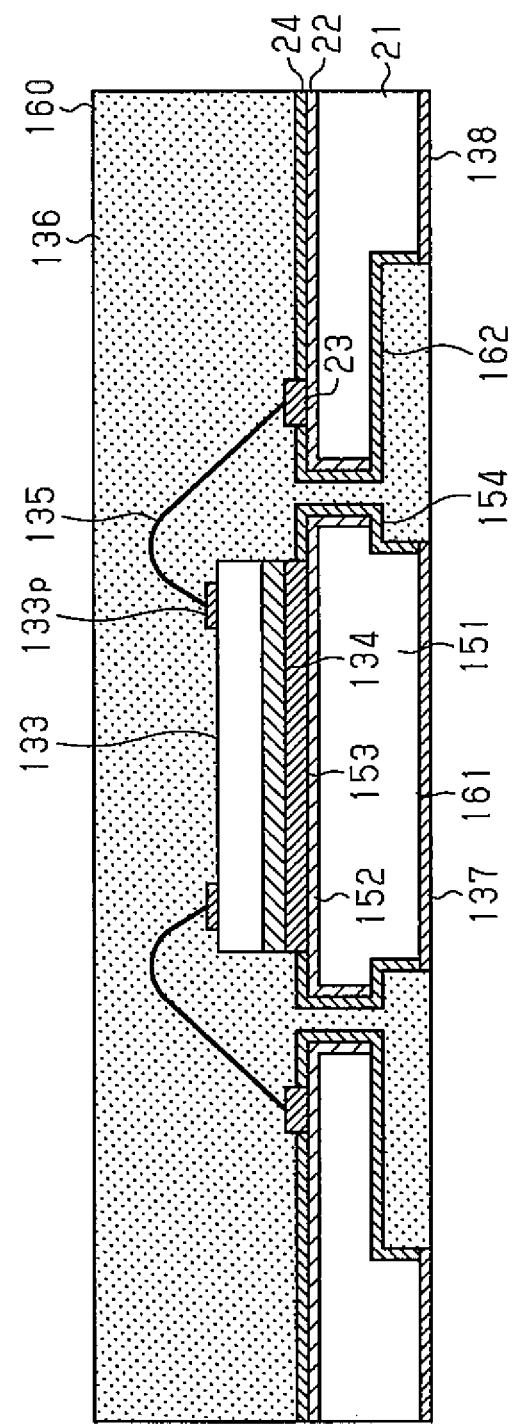
FIG. 13B is a schematic cross-sectional view of a semiconductor device including a lead formed in the lead frame illustrated in FIG. 13A.

FIG. 13A illustrates a third modified example of a lead frame 170. FIG. 13B illustrates a semiconductor device 160 using the lead frame 170. The semiconductor device 160 is a semiconductor device of a quad flat non-leaded (QFN) package.

As illustrated in FIG. 13B, the semiconductor device 160 includes a die pad 161, a plurality of leads 162, the semiconductor element 133, the solder 134, the wires 135, and the encapsulation resin 136.

As illustrated in FIG. 13A, the lead frame 170 includes the die pad 161 and the plurality of leads 162.

The die pad 161 includes the base 151, the rough-surface plating layer 152, the plating layer 153, and the oxide film 154. Each lead 162 includes the base 21, the rough-surface plating layer 22, the plating layer 23, and the oxide film 24.

As illustrated in FIGS. 13A and 13B, the rough-surface plating layer 152 covers only upper and side (upper side) surfaces of the base 151 of the die pad 161. In the same manner as the leads 111 (refer to FIGS. 10A and 10B) of the first modified example, the rough-surface plating layer 22 covers only the upper surface 21a, the distal end surface 21c, and the longitudinal side surfaces of the base 21 of each lead 162. When the rough-surface plating layer 152 of the die pad 161 is formed in this manner, the oxide film 154 of the die pad 161 limits undesirable wetting and spreading of the solder 134 and misalignment of the semiconductor element 133 in the same manner as the oxide film 154 (refer to FIGS. 11A and 11B) of the die pad 131 of the second modified example. In the third modified example, the wires 135 are connected to the plating layer 23 of each lead 162. Thus, the oxide film 24 may be omitted from the leads 162.

Fourth Modified Example

Figure 15:
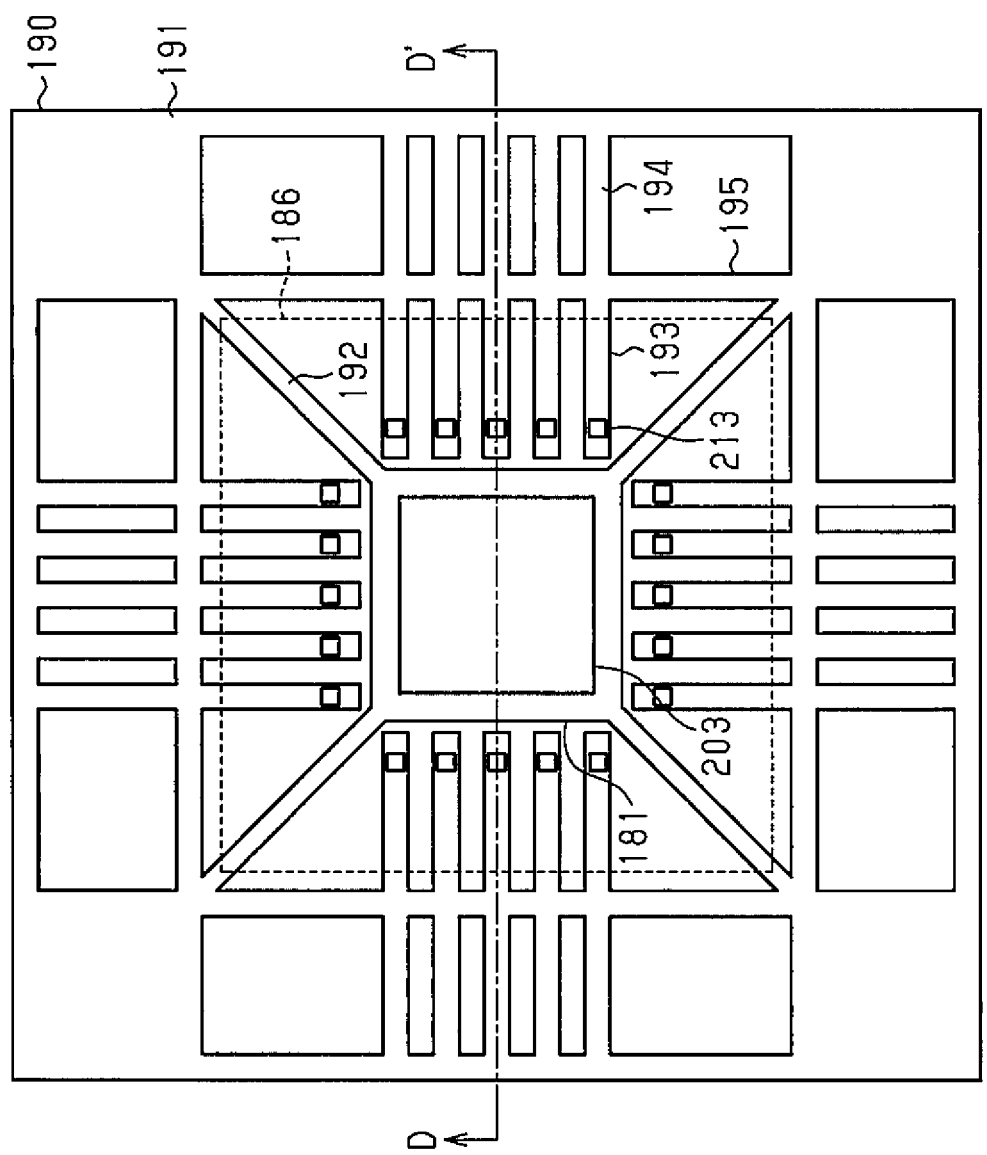
FIG. 15 is a schematic plan view of the lead frame illustrated in FIG. 14A.

FIGS. 14A and 15 illustrate a fourth modified example of a lead frame 190. FIG. 14A is a cross-sectional view of the lead frame 190 taken along line D-D' in FIG. 15. FIG. 14B illustrates a semiconductor device 180 using the lead frame 190.

As illustrated in FIG. 14B, the semiconductor device 180 includes a die pad 181, a plurality of leads 182, a semiconductor element 183, solder 184, wires 185, an encapsulation resin 186, and an external plating layer 187. The semiconductor device 180 is a semiconductor device of a quad flat package (QFP).

The semiconductor element 183 is mounted on the upper surface of the die pad 181 via the solder 184. The die pad 181 is located at a position lower than the inner end portion of each lead 182. The semiconductor element 183 has an upper surface including electrodes 183p. The electrodes 183p are connected to the leads 182 by the wires 185. The wires 185 are formed, for example, by fine wires of gold (Au), copper (Cu), or aluminum (Al). The die pad 181, the semiconductor element 183, the solder 184, the wires 185, and part of the leads 182 are encapsulated by the insulative encapsulation resin 186. The external plating layer 187 covers projection portions (outer leads) of the leads 182 projecting from the encapsulation resin 186. The projection portions are bent like a gull wing. The external plating layer 187 is the same as the external plating layer 15 of the embodiment and is formed in the same manner as the external plating layer 15.

As illustrated in FIGS. 14A and 15, the lead frame 190 includes a frame portion 191, the die pad 181, support bars 192, inner leads 193, outer leads 194, and a dam bar 195. The frame portion 191 is shaped as a generally tetragonal frame. The die pad 181 is shaped as a generally tetragonal plate. The die pad 181 is supported by a plurality of (four in FIG. 15) support bars 192 connected to the frame portion 191 and is located at a center of the frame portion 191. A plurality of inner leads 193 are arranged around the die pad 181 and connected to the dam bar 195. Also, the basal ends of a plurality of outer leads 194 are connected to the dam bar 195. The distal ends of the outer leads 194 are connected to the frame portion 191. The inner leads 193 and the outer leads 194 form the leads 182 illustrated in FIGS. 14A and 14B. In FIG. 15, the portion indicated by broken lines illustrates the region encapsulated by the encapsulation resin 186 (refer to FIG. 14B).

As illustrated in FIG. 14A, the die pad 181 includes a base 201, a rough-surface plating layer 202, a plating layer 203, and an oxide film 204. The rough-surface plating layer 202 covers the entire surface of the base 201. The plating layer 203 is formed on an upper surface (rough surface) of the rough-surface plating layer 202. The oxide film 204 covers the entire surface of the rough-surface plating layer 202 excluding the plating layer 203. The leads 182 (inner leads 193 and outer leads 194) include a base 211, a rough-surface plating layer 212, a plating layer 213, and an oxide film 214. The rough-surface plating layer 212 covers the entire surface of the base 211. The plating layer 213 is formed on an upper surface (rough surface) of the rough-surface plating layer 212 at the inner end portion of the leads 182. The oxide film 214 covers the entire surface of the rough-surface plating layer 212 excluding the plating layer 213. The base 201 of the die pad 181 and the base 211 of the leads 182 are formed by etching a single metal plate (e.g., copper plate).

The oxide film 204 of the die pad 181 of the fourth modified example limits wetting and spreading of the solder 184 and misalignment of the semiconductor element 183 in the same manner as the second modified example (refer to FIGS. 11A and 11B). The oxide film 204 limits separation of the encapsulation resin 186 from the die pad 181. The oxide film 214 limits separation of the encapsulation resin 186 from the leads 182.

Fifth Modified Example

FIG. 16A illustrates a fifth modified example of a lead frame 230. FIG. 16B illustrates a semiconductor device 220 using the lead frame 230.

As illustrated in FIG. 16B, the semiconductor device 220 includes the die pad 181, a plurality of leads 221, the semiconductor element 183, the solder 184, the wires 185, and the encapsulation resin 186. The semiconductor device 220 is a semiconductor device of a quad flat package (QFP).

As illustrated in FIGS. 16A and 16B, the leads 221 include the base 211, the rough-surface plating layer 212, and the plating layer 213. That is, each lead 221 does not include the oxide film 214 of the fourth modified example illustrated in FIGS. 14A and 14B. The surface of the rough-surface plating layer 212 is rough. The rough surface allows the leads 221 to strongly adhere to the encapsulation resin 186. In the same manner as the fourth modified example, an external plating layer may cover the surface of the rough-surface plating layer 212 of the projection portion (outer lead) of each lead 221 projecting from the encapsulation resin 186.

Sixth Modified Example

Figure 17:
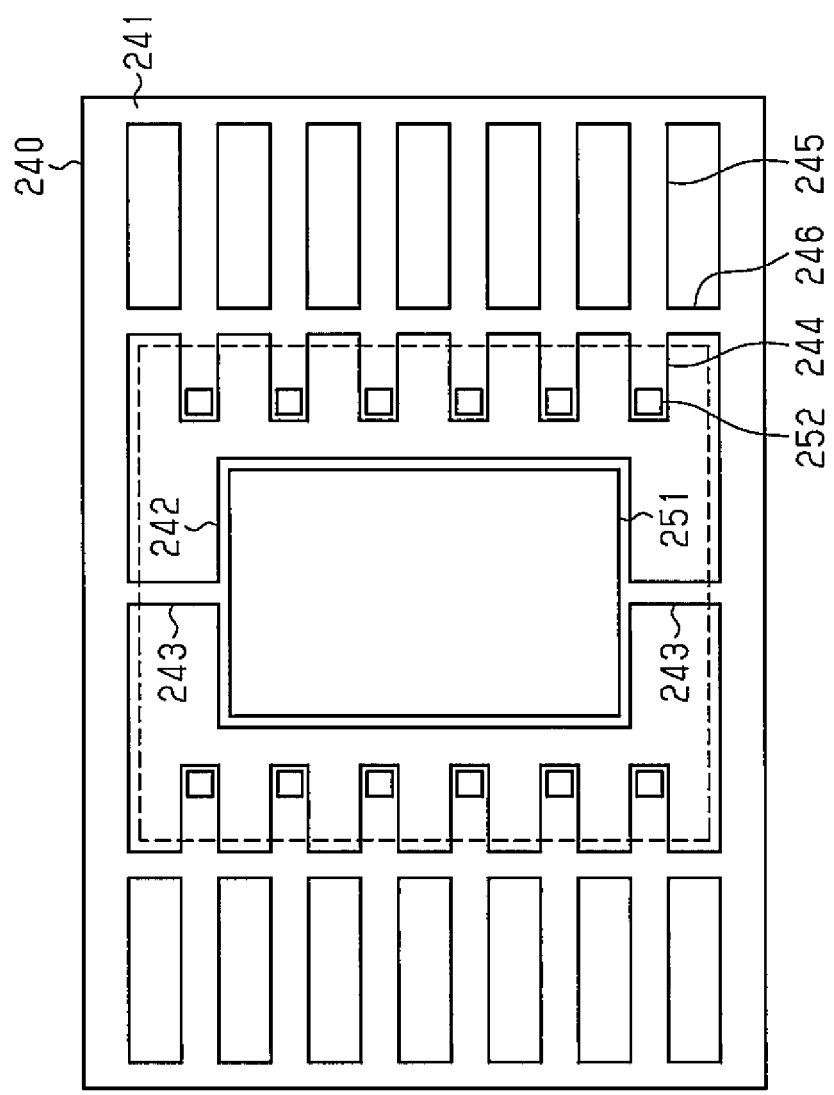
FIG. 17 is a schematic plan view illustrating another modified example of a lead frame.

FIG. 17 illustrates a sixth modified example of a lead frame 240. The lead frame 240 may be used in a semiconductor device of a small outline package (SOP).

The lead frame 240 includes a frame portion 241, a die pad 242, support bars 243, inner leads 244, outer leads 245, and a dam bar 246.

The frame portion 241 is shaped as a rectangular frame. The die pad 242 is shaped as a rectangular plate. The die pad 242 is supported by a plurality of (two, in FIG. 17) support bars 243 and is located at a center of the frame portion 241. A plating layer 251 is formed on the die pad 242.

The inner leads 244 are connected to the dam bar 246 and are arranged at the left and right sides of the die pad 242. A plating layer 252 is formed on a distal end portion of each inner lead 244. Each outer lead 245 has a basal end connected to the dam bar 246 and a distal end connected to the frame portion 241. The inner leads 244 and the outer leads 245 form leads.

In the same manner as the above embodiment and modified examples, the lead frame 240 having such configurations includes a base, a rough-surface plating layer covering the base, and an oxide film covering the rough-surface plating layer. Thus, in a semiconductor device using the lead frame 240, the oxide film limits wetting and spreading of solder and misalignment of the semiconductor device on the die pad 242.

Other Modified Examples

The above embodiment and modified examples are applied to lead frames and semiconductor devices of a QFN, a QFP, or an SOP. However, the above embodiment and modified examples may be applied to lead frames and semiconductor devices of other surface mount packages such as an SOJ or a TSOP. Also, the above embodiment and modified examples may be applied to lead frames and semiconductor devices of an insertion mount package such as a DIP.

The above embodiment and modified examples are applied to a lead frame and a semiconductor device on which a single semiconductor element is mounted. However, the above embodiment and modified examples may be applied to a lead frame and a semiconductor device on which multiple semiconductor elements are mounted.

In the above embodiment and modified examples, the shapes of leads and die pads may be changed. For example, in FIGS. 11A and 11B, each lead and the die pad may be configured so that the upper surface is equal in length to the lower surface. As described above, a strong adhesion is obtained between the oxide film 154 and the encapsulation resin 136. Thus, separation of the die pad 131 from the encapsulation resin 136 is limited.

Clauses

This disclosure further encompasses the following embodiments.

1. A method for manufacturing a lead frame, the method including:

forming a rough surface on a conductive member by performing a roughening process on the conductive member;

forming a plating layer on the rough surface by performing a plating process on the rough surface, wherein the plating layer is configured to be connected to a semiconductor element; and forming an oxide film covering the rough surface at least around the plating layer by performing an oxidation process on the rough surface at least around the plating layer.

2. The method according to clause 1, wherein the oxidation process includes a forced oxidation process performing an anodic oxidation process with the conductive member immersed in a blackening treatment solution.

3. The method according to clause 1 or 2, wherein the conductive member includes a base, and the roughening process includes a rough plating process forming a rough-surface plating layer on the base with the base immersed in a plating solution.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A lead frame comprising:
a conductive member including
a conductive base, and
a rough-surface plating layer having a rough surface and formed on at least an upper surface of the base excluding a lower surface of the base;
a plating layer formed on the rough surface and configured to be connected to a semiconductor element; and
an oxide film covering the rough surface of the rough-surface plating layer and at least partially covering the lower surface of the base.

2. The lead frame according to claim 1, wherein the oxide film is formed by a copper oxide coating including a hydroxide.

3. The lead frame according to claim 1, wherein the oxide film has acicular crystals.

4. The lead frame according to claim 1, wherein the rough surface of the rough-surface plating layer has a roughness that is greater than that of a surface of the base at a portion covered by the rough-surface plating layer.

5. The lead frame according to claim 1, wherein the rough-surface plating layer includes copper.

6. The lead frame according to claim 1, wherein the oxide film comprises an oxide of a plating metal of the rough-surface plating layer and an oxide of a metal of the base.

7. The lead frame according to claim 1, wherein the rough-surface plating layer covers the upper surface of the base, a distal end surface of the base opposite to a cutting position of the lead frame, and a longitudinal side surface of the base.

8. The lead frame according to claim 1, wherein the conductive member includes a die pad and a lead, each of the die pad and the lead includes the rough surface,
the plating layer includes
a first plating layer formed on the rough surface of the die pad, and
a second plating layer formed on the rough surface of the lead, and
the oxide film includes a first oxide film covering the rough surface of the die pad at least around the first plating layer.

9. The lead frame according to claim 8, wherein the oxide film further includes a second oxide film covering the rough surface of the lead at least around the second plating layer.

10. The lead frame according to claim 1, wherein the rough-surface plating layer is arranged on the upper surface of the base and a portion of a side surface of the base, and the oxide film is arranged on the rough surface of the rough-surface plating layer and a portion of the base exposed from the rough-surface plating layer.

11. The lead frame according to claim 1, wherein the rough-surface plating layer is arranged at least partially on a portion of the base covered by an encapsulation resin when the lead frame is encapsulated by the encapsulation resin, and the oxide film is arranged on the rough surface of the rough-surface plating layer and a portion of the base exposed from the rough-surface plating layer.

12. The lead frame according to claim 1, wherein the base contains copper.

13. A semiconductor device comprising:
a semiconductor element including an electrode;
a lead including
a conductive member including
a conductive base, and
a rough-surface plating layer having a rough surface and formed on at least an upper surface of the base excluding a lower surface of the base,
a plating layer formed on the rough surface, and
an oxide film covering the rough surface of the rough-surface plating layer and at least partially covering the lower surface of the base;
solder connecting the electrode to the plating layer; and
an encapsulation resin covering the semiconductor element, the solder, and part of the lead.

14. The semiconductor device according to claim 13, wherein at least a portion of the lower surface of the base of the lead is an exposed surface that is exposed from the rough-surface plating layer, the oxide film, and the encapsulation resin, the semiconductor device further comprising an external plating layer arranged on the exposed surface of the base of the lead.

15. The semiconductor device according to claim 13, wherein the rough surface of the rough-surface plating layer has a roughness that is greater than that of a surface of the base at a portion covered by the rough-surface plating layer.

16. The semiconductor device according to claim 13, wherein the oxide film comprises an oxide of a plating metal of the rough-surface plating layer and an oxide of a metal of the base.

17. A semiconductor device comprising:
a semiconductor element including an electrode;
a lead;

a die pad including
- a conductive member including
  - a conductive base, and
  - a rough-surface plating layer having a rough surface and formed on at least an upper surface of the base excluding a lower surface of the base,
- a plating layer formed on the rough surface, and
- an oxide film covering the rough surface of the rough-surface plating layer and at least partially covering the lower surface of the base;

solder connecting the semiconductor element and the plating layer;

a wire connecting the electrode of the semiconductor element to the lead; and an encapsulation resin covering the semiconductor element, the die pad, the solder, the wire, and part of the lead.

18. The semiconductor device according to claim 17, wherein at least a portion of the lower surface of the base of the die pad is an exposed surface that is exposed from the rough-surface plating layer, the oxide film, and the encapsulation resin, the semiconductor device further comprising an external plating layer arranged on the exposed surface of the base of the die pad.

19. The semiconductor device according to claim 17, wherein the rough surface of the rough-surface plating layer has a roughness that is greater than that of a surface of the base at a portion covered by the rough-surface plating layer.

20. The semiconductor device according to claim 17, wherein the oxide film comprises an oxide of a plating metal of the rough-surface plating layer and an oxide of a metal of the base.

* * * * *